(12) United States Patent
Weingarten

(10) Patent No.: US 12,039,191 B2
(45) Date of Patent: Jul. 16, 2024

(54) SYSTEM AND METHOD FOR PRE-SOFT-DECODING TRACKING FOR NAND FLASH MEMORIES

(71) Applicant: Kioxia Corporation, Tokyo (JP)

(72) Inventor: Hanan Weingarten, Tel Aviv (IL)

(73) Assignee: KIOXIA CORPORATION, Tokyo (JP)

( * ) Notice: Subject to any disclaimer, the term of this patent is extended or adjusted under 35 U.S.C. 154(b) by 234 days.

(21) Appl. No.: 17/574,929

(22) Filed: Jan. 13, 2022

(65) Prior Publication Data

US 2023/0221879 A1   Jul. 13, 2023

(51) Int. Cl.
*G11C 7/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .................................................... G06F 3/0679
USPC .................................................... 365/189.09
See application file for complete search history.

(56) References Cited

U.S. PATENT DOCUMENTS

| | | | |
|---|---|---|---|
| 10,963,338 B1 | 3/2021 | Steiner et al. | |
| 11,024,391 B1 * | 6/2021 | Steiner | G06F 11/1024 |
| 2019/0370111 A1 * | 12/2019 | Barbato | G11C 29/42 |
| 2020/0319964 A1 * | 10/2020 | Kim | G06F 12/0882 |

FOREIGN PATENT DOCUMENTS

TW   202131164 A   8/2021

* cited by examiner

*Primary Examiner* — Hoai V Ho
(74) *Attorney, Agent, or Firm* — Foley & Lardner LLP

(57) ABSTRACT

A flash memory system may include a flash memory and a circuit for performing operations on the flash memory. The circuit may be configured to obtain a first soft read sample by performing a first read operation on a location of the flash memory with a first reference voltage. The circuit may be configured to determine a second reference voltage based on the first soft read sample. The circuit may be configured to obtain a second soft read sample by performing a second read operation on the location of the flash memory with the second reference voltage. The circuit may be configured to generate soft information based on the first and second soft read samples. The circuit may be configured to decode a result of a third read operation on the location of the flash memory based on the soft information.

26 Claims, 24 Drawing Sheets

Obtaining a first soft read sample by performing a first read operation on a location of the flash memory with a first reference voltage 2202

Determining a second reference voltage based on the first soft read sample 2204

Obtaining a second soft read sample by performing a second read operation on the location of the flash memory with the second reference voltage 2206

Generating soft information based on the first and second soft read samples 2208

Decoding a result of a third read operation on the location of the flash memory based on the soft information 2210

2200

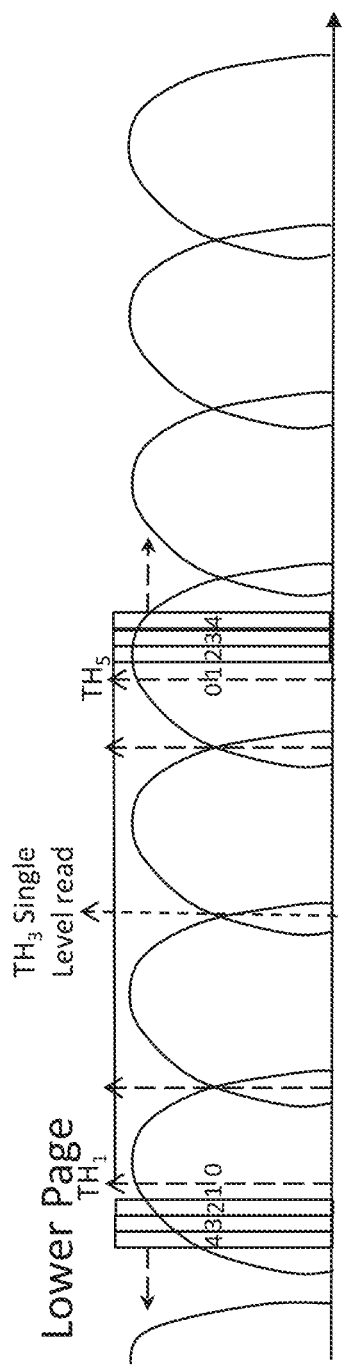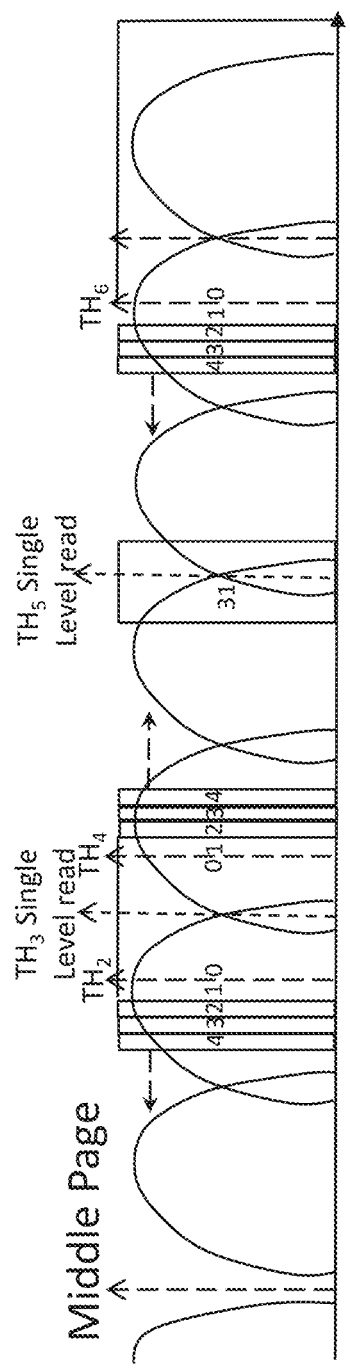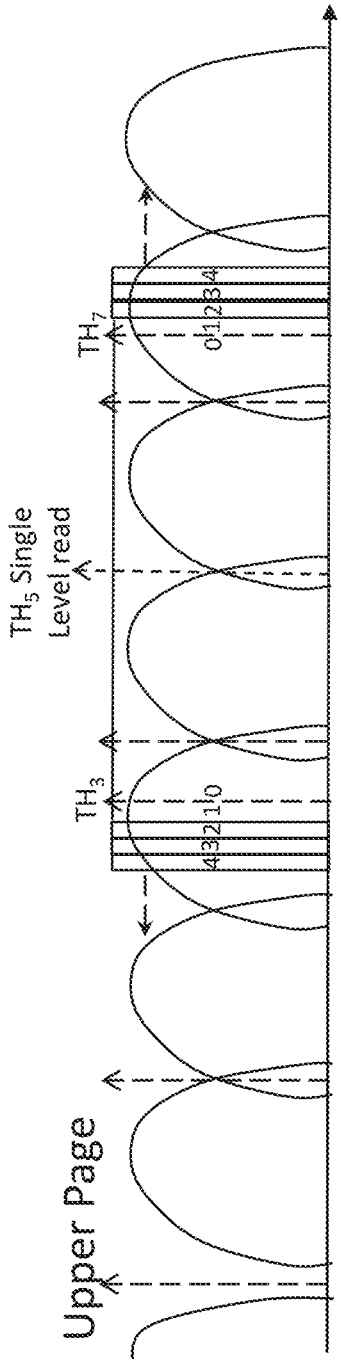

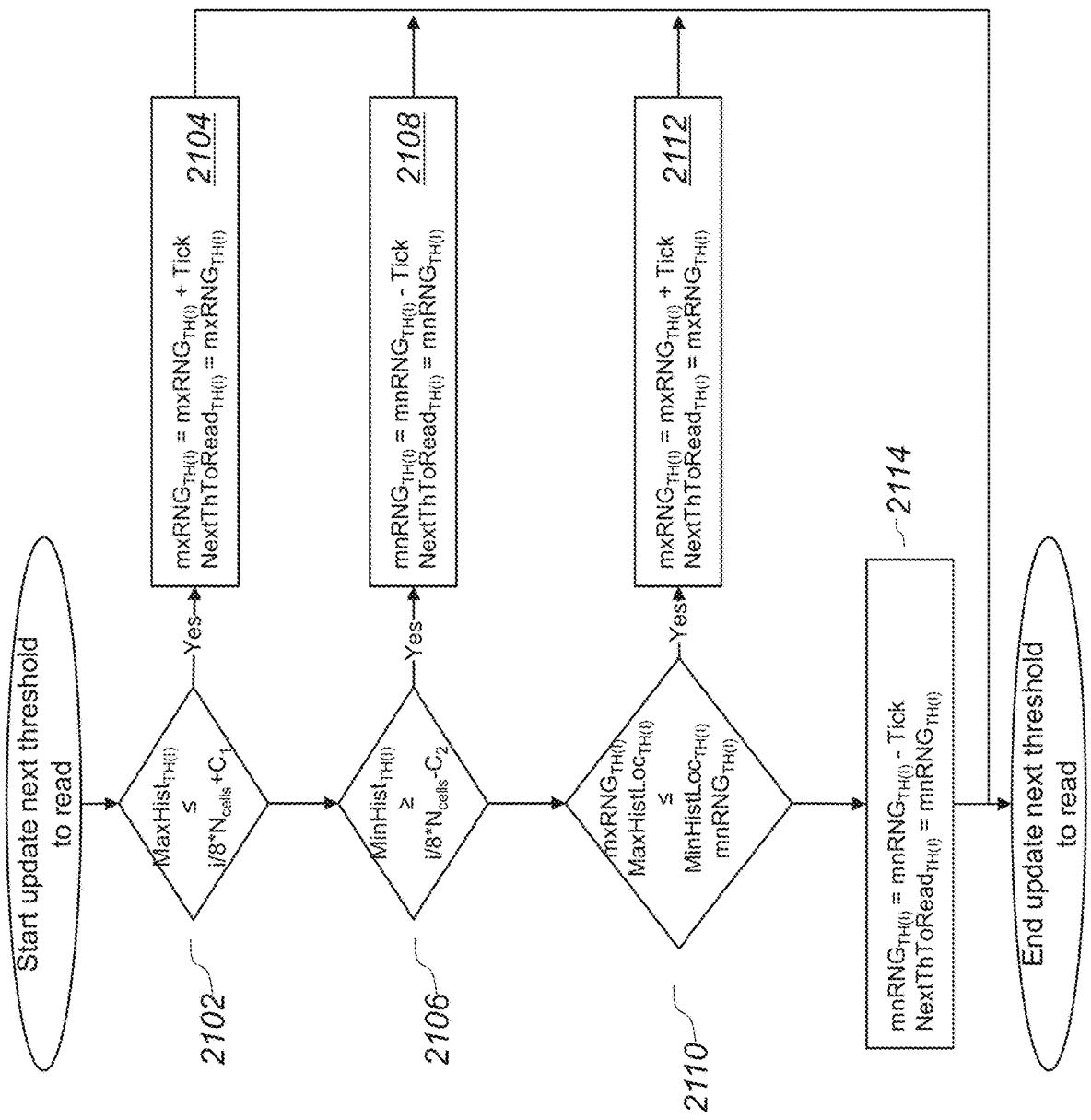

SYSTEM AND METHOD FOR PRE-SOFT-DECODING TRACKING FOR NAND FLASH MEMORIES

TECHNICAL FIELD

The present arrangements relate generally to system and method for performing operations of a flash memory, and more particularly to system and method for determining optimal read reference voltages based on soft read samples to improve reliability of soft decoding.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

In NAND flash devices, soft sampling may be performed to generate soft information by changing read thresholds and reading a NAND flash device several times. Then, soft decoding is performed based on the soft information generated by the soft sampling. Improvements in soft decoding capabilities in NAND flash devices remain desired.

SUMMARY

The present arrangements relate to system and method for determining optimal read reference voltages based on soft read samples to improve reliability of soft decoding.

According to certain aspects, arrangements provide a method for performing operations on a flash memory may include obtaining a first soft read sample by performing a first read operation on a location of the flash memory with a first reference voltage. The method may include determining a second reference voltage based on the first soft read sample. The method may include obtaining a second soft read sample by performing a second read operation on the location of the flash memory with the second reference voltage. The method may include generating soft information based on the first and second soft read samples. The method may include decoding a result of a third read operation on the location of the flash memory based on the soft information.

According to other aspects, arrangements provide a flash memory system including a flash memory and a circuit for performing operations on the flash memory. The circuit may be configured to obtain a first soft read sample by performing a first read operation on a location of the flash memory with a first reference voltage. The circuit may be configured to determine a second reference voltage based on the first soft read sample. The circuit may be configured to obtain a second soft read sample by performing a second read operation on the location of the flash memory with the second reference voltage. The circuit may be configured to generate soft information based on the first and second soft read samples. The circuit may be configured to decode a result of a third read operation on the location of the flash memory based on the soft information.

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein:

FIG. 1B to FIG. 1D illustrate example processes of soft sampling of pages of a flash device;

FIG. 21 is a flowchart illustrating an example methodology for updating a next threshold voltage according to some arrangements.

DETAILED DESCRIPTION

According to certain aspects, arrangements in the present disclosure relate to techniques for determining optimal read reference voltages (or threshold voltages) based on soft read samples to improve reliability of soft decoding.

Before describing problems to be solved by arrangements of the present disclosure, an example soft sampling process will be described with reference to FIG. 1A to FIG. 2B.

NAND memory devices may tend to accumulate errors over time due to different types of stresses that may be applied to the NAND. Different techniques can be used to handle high number of errors during a read from a NAND device. These techniques include (1) re-optimizing optimal read thresholds, and (2) soft decoding.

To store information in a NAND transistor, electron charge is injected to a floating gate or an insulating layer within the transistor. Injected charge may be detected by applying voltage to a transistor control gate. If the transistor remains closed, the amount of injected charge is higher than a certain level. For example, in a triple-level cells (TLC) transistor, 3 bits are stored per cell. To implement a TLC transistor, one of 8 levels of charge is injected to distinguish between different charge options (3 bit combinations) through a threshold voltage (VT) required to open the gate. Similarly, in a quad-level cells (QLC; 4 bits per cell) or Penta-level cell (PLC; 5 bits per cell) transistor, 16 or 32 levels of charge are used per transistor to encode 4 or 5 bits. In the following, the TLC case will be used as an example but the present disclosure is not limited to TLC.

The number of electrons injected is typically limited and therefore, the accuracy of the injected charge is limited. In addition, the charge changes due to various stresses that are applied to the NAND device. As a result, when reading back the cell, the charge level, or alternatively, the minimum voltage applied to the transistor control gate to open it, may vary with in a certain range for every charge level (or bit combination) that is used. Therefore, adjusting the control gate voltage levels (also called "read levels" or "read thresholds" or "threshold voltages" or "reference voltages") according to the state of the NAND, can significantly reduce the number of errors.

NAND cells are programmed and read in pages, where a page contains a collection of NAND transistors that share a control gate. A page may contain several tens of thousands of transistors or more and the transistor charge within a page can be distributed around each one of the target charge levels. The charge level per transistor may not be directly measured but can be measured through its proxy, e.g., the minimum control gate voltage required to open the transistor. The distribution of the charge within a page, as measured through its proxy, is referred to as a VT distribution.

Figure 1A:
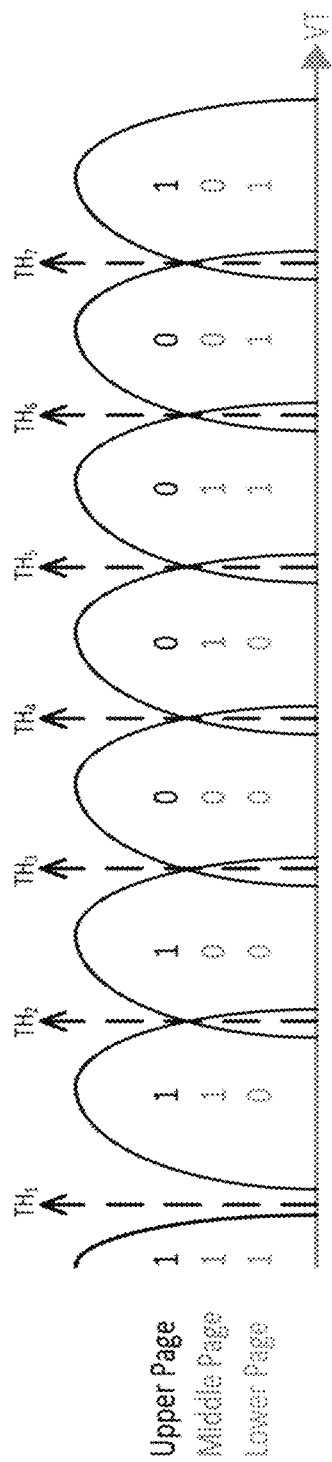
FIG. 1A illustrates threshold voltage distribution in a conventional three bits per cell (bpc) flash device.

FIG. 1A illustrates a threshold voltage distribution in a conventional three bits per cell (bpc) flash device. FIG. 1A depicts such a VT distribution where the X-axis denotes the minimum VT level (threshold voltage) required to make the transistor open and the Y-axis denotes the number of cells corresponding to a certain threshold voltage VT. FIG. 1A also shows an example of a TLC NAND allocation of bit combination per charge level (or lobe). Various such bit allocations are possible and will typically be allocated according to gray coding with one but changing from one level to the next. In TLCS NAND, for each lobe, 3 bits are used and the bits are denoted by "lower", "middle" and "upper" pages (or page bits).

Typically, when a page is being read, a NAND device reads just one of the bits within each transistor in the page. That is, the NAND device would only read either the lower or middle or upper bits of the page. For example, in the example in FIG. 1A, to read the lower page (lower bits of the page), the device would perform a first read and apply a voltage TH1 (see FIG. 1A) to a shared control gate and the device would check which cells are open. Next, the NAND device would internally perform a second read with voltage TH5 (see FIG. 1A). All cells which are open on both reads or closed on both reads will take the logical value "1". The rest of the cells will take the logical value "0". Similarly, to read the middle page, the NAND device performs internally 3 reads with voltages TH2, TH4 and TH6, and to read the upper page, the NAND device performs internally 2 reads with voltages TH3 and TH7. As there may be different allocation of bits to lobes on different types of NAND devices, the choice of the thresholds to read a certain page may vary. The choice of the thresholds will also vary between TLC, QLC or other types of devices.

Typically, given a certain VT distribution, optimal read levels can be set. However, this may not be sufficient to successfully read the page and decode it. The lobe distributions may overlap significantly and even with optimal read levels a NAND device will get too many errors for the error correction code (ECC) engine to correct. For that reason, decoding is performed based on soft information. Using soft information, the NAND device can distinguish between cells that are close to the optimal read thresholds and those which are further away. Those cells that are closer to the read levels are less reliable as they are more likely to belong to the neighboring lobe. Providing such "soft" information to the decoder can greatly assist in the decoding process.

FIG. 1B to FIG. 1D illustrate example processes of soft sampling of pages of a flash device.

In order to gain "soft" information per cell, a NAND device can perform several page reads (lower/middle/upper). The reads differ with the read threshold levels being used. FIG. 1B depicts how the soft decoding thresholds may change during lower page reads for a TLC example. Similarly, FIG. 1C and FIG. 1D depict how the soft decoding thresholds may change during middle and upper page reads. In this example, referring to FIG. 1B, soft reads of the lower page start with a lower page read with TH1 threshold set above the optimal read value and TH5 set below the optimal read value. All cells that are detected as lying between TH1 and TH5 (lower page read thresholds) are labeled as "0". Next, the TH1 threshold can shift slightly to the left and the TH5 threshold can shift slightly to the right, and then perform another read. All cells that were not previously labelled and that were detected as lying between TH1 and TH5 (that is, having logical zero value) are labeled as "1". The process can be repeated, for example, iteratively shifting TH1 and TH5 and increasing the label (e.g., "2", "3", "4", etc.). After performing a final read operation, the remaining cells that were not previously labeled can be labeled with the next label value. In order to differentiate between cells that lie around the optimal read threshold for TH1 and those around TH5, another single level read (as opposed to page read) can be read at TH3 level (as shown in FIG. 1B). In the above soft read example, a specific number of read iterations can be chosen according to the soft information accuracy needed. In case 31 reads are performed, 32 labels will be obtained. The threshold steps and initial position can be designed such that labels 15 and 16 are found on both sides of the optimal read threshold.

Referring to FIG. 1C, to perform soft reads for the middle page, a NAND device can similarly perform page reads with TH2, TH4 and TH6 (middle page read thresholds). The device can start with setting TH2 and TH6 to the right of their perspective optimal read values and TH4 to the left of its optimal read value. The device can label cells which were not labelled previously and that lie between TH2 and TH4 or to the right of TH6, which are cells that have a zero logical value.

Referring to FIG. 1D, the upper page can be sampled similarly as the lower page using TH3 and TH7 (upper page read thresholds). In general, for all pages, labels are set for all cells that are read as logical zero value and that were not previously labeled.

Figure 2B:
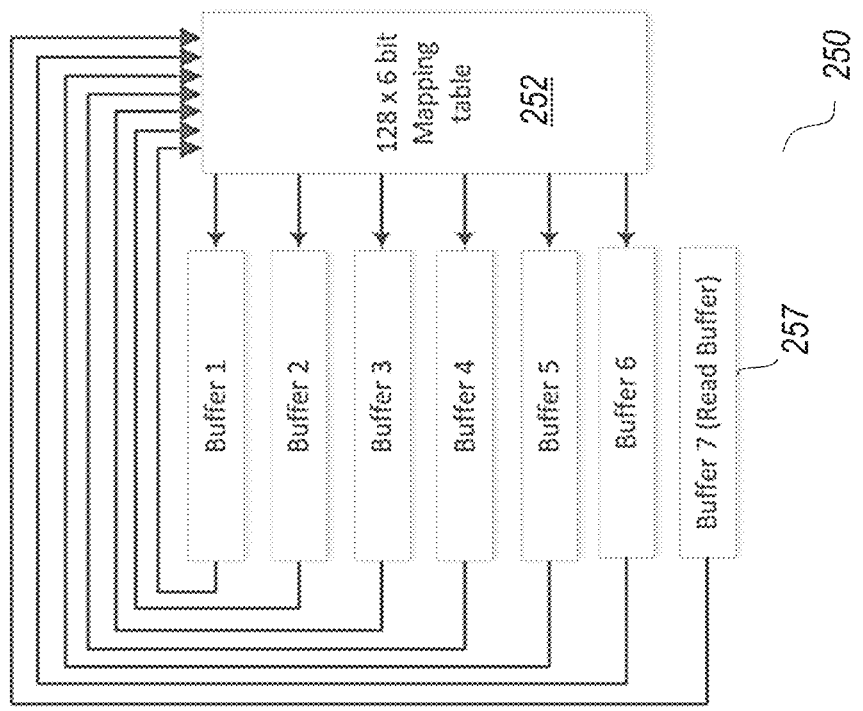
FIG. 2A and FIG. 2B illustrate example labeling engines according to some arrangements.
Figure 2A:
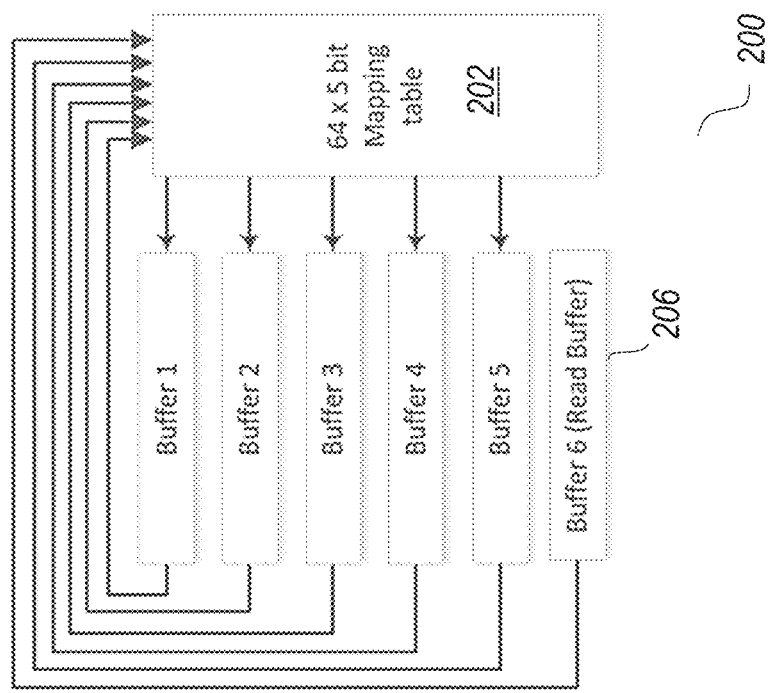

FIG. 2A and FIG. 2B illustrate example labeling engines according to some arrangements. In order to perform such labeling (as shown in FIG. 1B to FIG. 1D) in a controller, a labeling engine (e.g., 200 in FIG. 2A and 250 in FIG. 2B) can be used. The labeling engine 200 may include data buffers 1 through 5 which will eventually hold the labels per cell and a read buffer 206 which holds page data being read from the NAND device. In addition, the labeling engine 200 may include a mapping table 202 which maps 6 bit inputs to 5 bit outputs. In some implementations, the mapping table may be a 64 by 5 bit mapping table.

Prior to soft sampling, buffers 1-5 may be all set to hold the highest label value. That is, for each cell, the corresponding bit may be associated in each of the buffers. The corresponding 5 bits in buffers 1-5 would then represent the label and they may be initially set to the highest label value. If the highest label value is 31, then all buffers may be set to all 1's. Per each soft read iteration, the NAND device may read the page into the read buffer. Then, the buffers 1-5 may be modified such that if the corresponding bit in the read buffer is "0" (zero value) and the corresponding label in buffers 1-5 is equal to the final label, the value of buffers 1-5 may be set to be the current iteration index (0 to 30). In some implementations, the setting of buffers 1-5 may be performed using the mapping table 202 which is applied to each of the corresponding bits in buffers 1-5, independently.

FIG. 2B shows a labeling engine 250 including 6 buffers, a page read buffer 257, and a 128×6 bit mapping table 252. This labeling engine can be used to label up to 64 soft labels or used in conjunction with two single-level cell (SLC) page read data in order to differentiate between the thresholds. It will be shown later how such a labeling engine is used to realign the labels around the optimal thresholds. Using soft sampling, a soft decoder can associate different levels of reliability to the labels and decode the data more reliably.

Now, problems to be solved by arrangements of the present disclosure will be described.

In a NAND (flash) device, decoding reliability can depend on the accuracy of the read thresholds. Typically fast methods for estimating the optimal read thresholds can be used. If (hard) decoding fails, the device can usually apply soft decoding based on "soft" read samples and perform soft decoding which yields higher reliability (than hard decoding).

In NAND devices, soft sampling may be performed to generate soft information by changing read thresholds (also called "read levels" or "threshold voltages" or "reference voltages or read threshold voltages) and reading a NAND device several times. Then, soft decoding is performed based on the soft information generated by the soft sampling. It may take additional long time to obtain accurate read threshold voltages prior to soft decoding by utilizing the "soft" reads themselves for this estimation. Moreover, reliability of the soft information can depend on estimating optimal positions of the read threshold voltages. Improvements in estimating or determining on optimal positions of the read threshold voltages are desired.

To address this problem, according to certain aspects, arrangements in the present disclosure relate to techniques for using additional "soft" read samples, prior to decoding, to sharpen an estimate of the optimal read positions and then relabel the soft read samples to account for the new estimate of the read thresholds (also called "pre-soft tracking"). After this procedure, a soft decoder in NAND memories and devices will be able to improve its reliability. In some implementations, a NAND device may use statistical characteristics of read samples as obtained from label histograms to optimize the read thresholds.

In some implementations, a NAND device may generate label histograms based on soft read samples to obtain more accurate estimates of the read thresholds. In addition to using label histograms, in some implementations, the NAND device may use at least one of (1) Laplace fitting slopes to estimate optimal read positions of threshold voltages, (2) a cumulative histogram or a cumulative distribution function (CDF) for range estimation, (3) intersection between right and lest slopes, or (4) an effective histogram minimum.

In some implementations, a NAND device may sample data and dynamically set sampling ranges in order to centralize an optimal point with respect to the sampling range. In this manner, the NAND device can address the problem that optimal points that are found on the edges of the sampling ranges may cause difficulties during the soft decoding later on and may require soft resampling of the data around the new found optimal points.

In some implementations, a flash memory system may include a flash memory and a circuit for performing operations on the flash memory. The circuit may be configured to obtain a first soft read sample by performing a first read operation on a location of the flash memory with a first reference voltage. The circuit may be configured to determine a second reference voltage based on the first soft read sample. The circuit may be configured to obtain a second soft read sample by performing a second read operation on the location of the flash memory with the second reference voltage. The circuit may be configured to generate soft information based on the first and second soft read samples. The circuit may be configured to decode a result of a third read operation on the location of the flash memory based on the soft information.

In some implementations, in determining the second reference voltage, the circuit may be configured to determine a sampling range based on the first soft read sample and determine the second reference voltage from within the sampling range. The second reference voltage may be a mid-point of the sampling range.

In some implementations, the circuit may be configured to generate a histogram based on a plurality of soft read samples. In determining the sampling range, the circuit may be configured to update the histogram based on the first soft read sample and determine the sampling range based on the histogram. In generating the histogram, the circuit may be further configured to generate a histogram per reference voltage.

In some implementations, in generating the histogram, the circuit may be configured to generate a cumulative histogram based on read results of a plurality of reference voltages. The circuit may be further configured to determine whether a threshold value of a maximum level of the cumulative histogram is greater than or equal to a maximum value of an expected cumulative histogram. In response to determining that the threshold value of the maximum level of the cumulative histogram is smaller than the maximum value of the expected cumulative histogram, the circuit may be configured to increase the maximum value of the sampling range. In response to determining that the threshold value of a minimum level of the cumulative histogram is greater than or equal to a minimum value of the expected cumulative histogram, the circuit may be configured to decrease a minimum value of the sampling range.

In some implementations, the circuit may be further configured to determine whether a difference between the threshold value of the maximum level of the cumulative histogram and the maximum value of the expected cumulative histogram is smaller than or equal to a difference between a threshold value of a minimum level of the cumulative histogram and a minimum value of the expected cumulative histogram. In response to determining that the difference between the threshold value of the maximum level of the cumulative histogram and the maximum value of the expected cumulative histogram is smaller than or equal to the difference between the threshold value of the minimum level of the cumulative histogram and a minimum value of the expected cumulative histogram, the circuit may be configured to increase the maximum value of the sampling range. In response to determining that the difference between the threshold value of the maximum level of the cumulative histogram and the maximum value of the expected cumulative histogram is greater than the difference between the threshold value of the minimum level of the cumulative histogram and the minimum value of the expected cumulative histogram, the circuit may be configured to decrease the minimum value of the sampling range.

Arrangements in the present disclosure have at least the following advantages and benefits.

First, arrangements in the present disclosure can provide useful techniques for obtaining more accurate read threshold voltages using additional "soft" read samples, prior to soft decoding, thereby improving reliability of a soft decoder.

Second, arrangements in the present disclosure can provide useful techniques for dynamically setting sampling ranges based on soft read samples in order to centralize the optimal point with respect to the sampling range. By setting the sampling range dynamically, the NAND device can significantly increase the chance that the optimal thresholds will lie around a mid-point of the sampling ranges and reduce the frequency of soft resampling.

Figure 3:
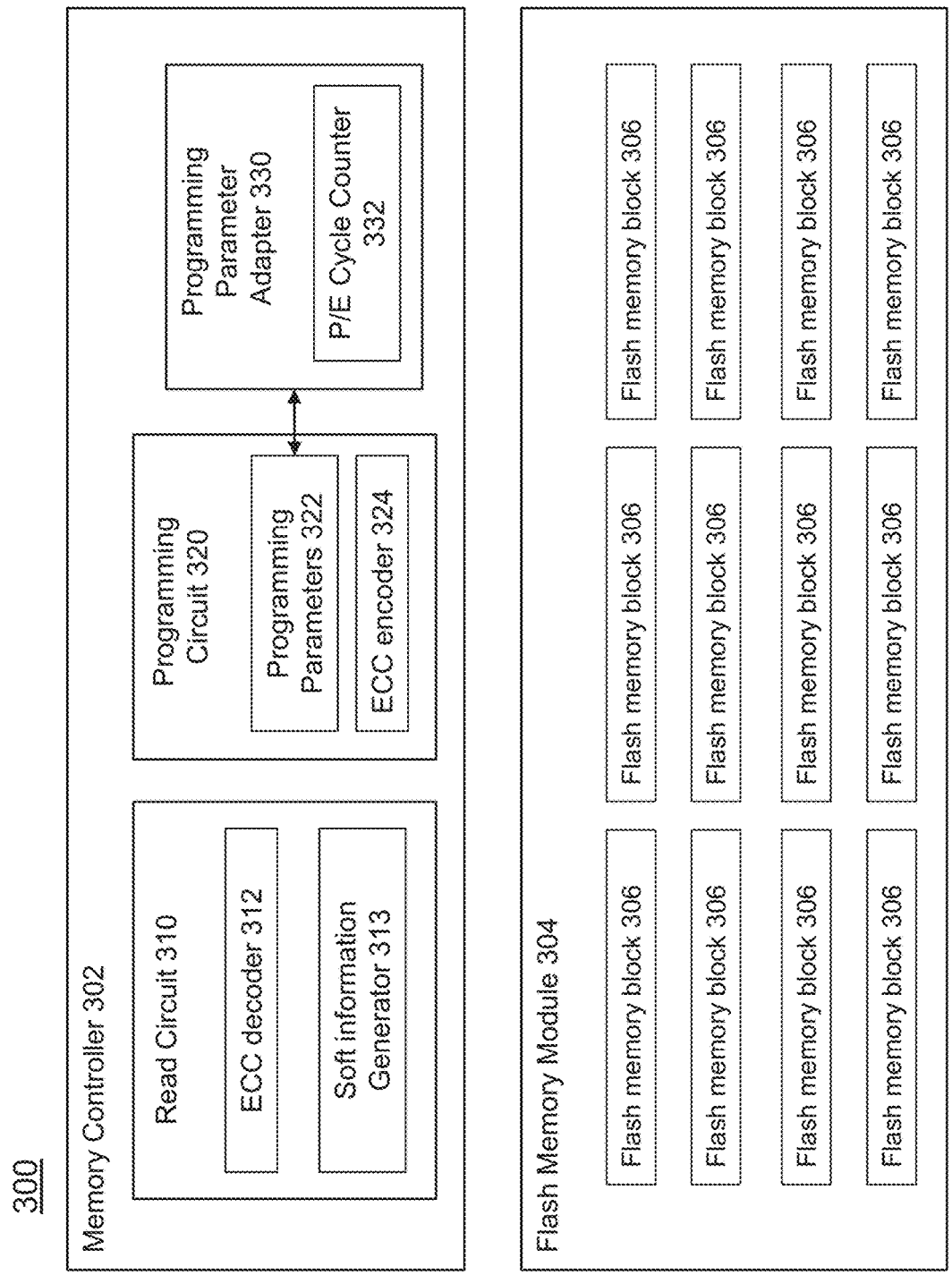
FIG. 3 illustrates is a block diagram illustrating an example flash memory system according to some arrangements.

FIG. 3 is a block diagram illustrating an example flash memory system 200 according to some arrangements, which can perform any of the methods described in the present disclosure.

The flash memory system 300 (e.g., NAND device, NAND flash device) may include a flash memory module or flash memory device 304 and a memory controller 302. The flash memory module 304 may include multiple flash memory blocks 306, each of which includes multiple flash memory rows/pages (not shown). In some arrangements, each of the multiple flash memory rows/pages may have a plurality of cells. Additionally or alternatively, the module 304 can comprise or be implemented using a plurality of dies, each of the dies containing a plurality of the blocks 306.

The memory controller 302 may include a read circuit 310, a programming circuit (e.g. a program DSP) 320 and a programming parameter adapter 330. As shown in FIG. 3, the adapter 330 can adapt the programming parameters 322 used by programming circuit 320 as described above. The adapter 330 in this example may include a Program/Erase (P/E) cycle counter 332. Although shown separately for ease of illustration, some or all of the adapter 330 can be incorporated in the programming circuit 320. In some arrangements, the read circuit 310 may include an ECC decoder 312 and a soft information generator 313. In some arrangements, the programming circuit 320 may include an ECC encoder 324. Arrangements of memory controller 302 can include additional or fewer components such as those shown in FIG. 3.

In some arrangements, a flash memory system (e.g., the flash memory system 300 in FIG. 3) may include a cell flash memory (e.g., the flash memory module 304 or a flash memory block 306 in FIG. 3) and a circuit (e.g., the read circuit 310 or the programming circuit 320 in FIG. 3) for performing operations of the plurality of cells. In some arrangements, the flash memory module 304 may have a plurality of cells. In some arrangements, each of the flash memory blocks 306 may have a plurality of cells. In some arrangements, the soft information generator 313 of the read circuit 310 may be configured to generate soft information based on estimated optimal positions of reference voltages (or threshold voltages). Methods of estimating optimal positions of reference voltages and generating soft information based on the estimated optimal positions by the soft information generator 313 according to some arrangements will be described below with reference to FIG. 4 to FIG. 22. The read circuit 310 may be configured to perform a read operation on the first cell and decode, via the ECC decoder 312, a result of the read operation on the first cell based on the soft information.

In some arrangements, the cell flash memory (e.g., the flash memory module 304 or a flash memory block 306 in FIG. 3) may include rows and columns of the plurality of cells. In some arrangements, a flash memory block 306 may include a plurality of pages (not shown) and a page may be defined as cells linked with the same word line, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 4:
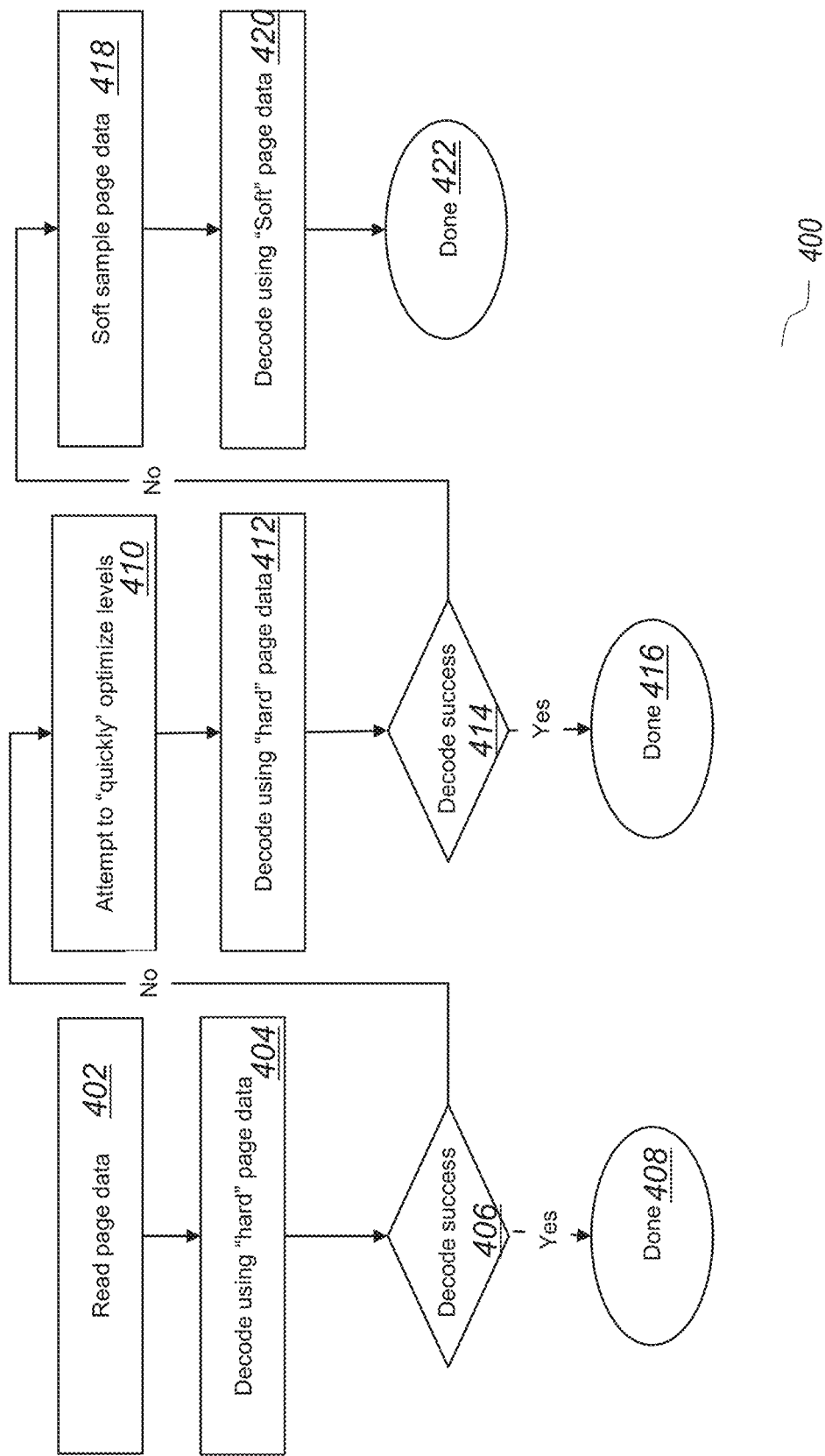
FIG. 4 is a flowchart illustrating an example methodology for reading and decoding a page in a NAND controller according to some arrangements.

FIG. 4 is a flowchart illustrating an example methodology for reading and decoding a page in a NAND controller according to some arrangements.

FIG. 4 shows a simplified yet typical read flow 400 in a NAND controller (e.g., memory controller 302 in FIG. 3). The flow may start with page reads with current read thresholds (S402) and perform a decode attempt (S404). If that attempt succeeds (S406), the flow may complete (S408). If that attempt fails, the controller may quickly perform a threshold calibration (S410). This calibration can be performed quickly to reduce overheads. After threshold recalibration, the controller may attempt decoding using "hard" page data (S412). If that attempt succeeds (S414), the flow may complete (S416). If that fails, the controller may perform soft page reads (S418) followed by soft decoding (S420), and then complete (S422). In this flow, as the controller uses a "quick" calibration, the threshold it can finds may not be correct or accurate. In some implementations, the calibration may perform additional reads; however, in order to reduce overheads, the controller may limit the number of additional reads and as a result, also limit calibration accuracy.

Figure 5:
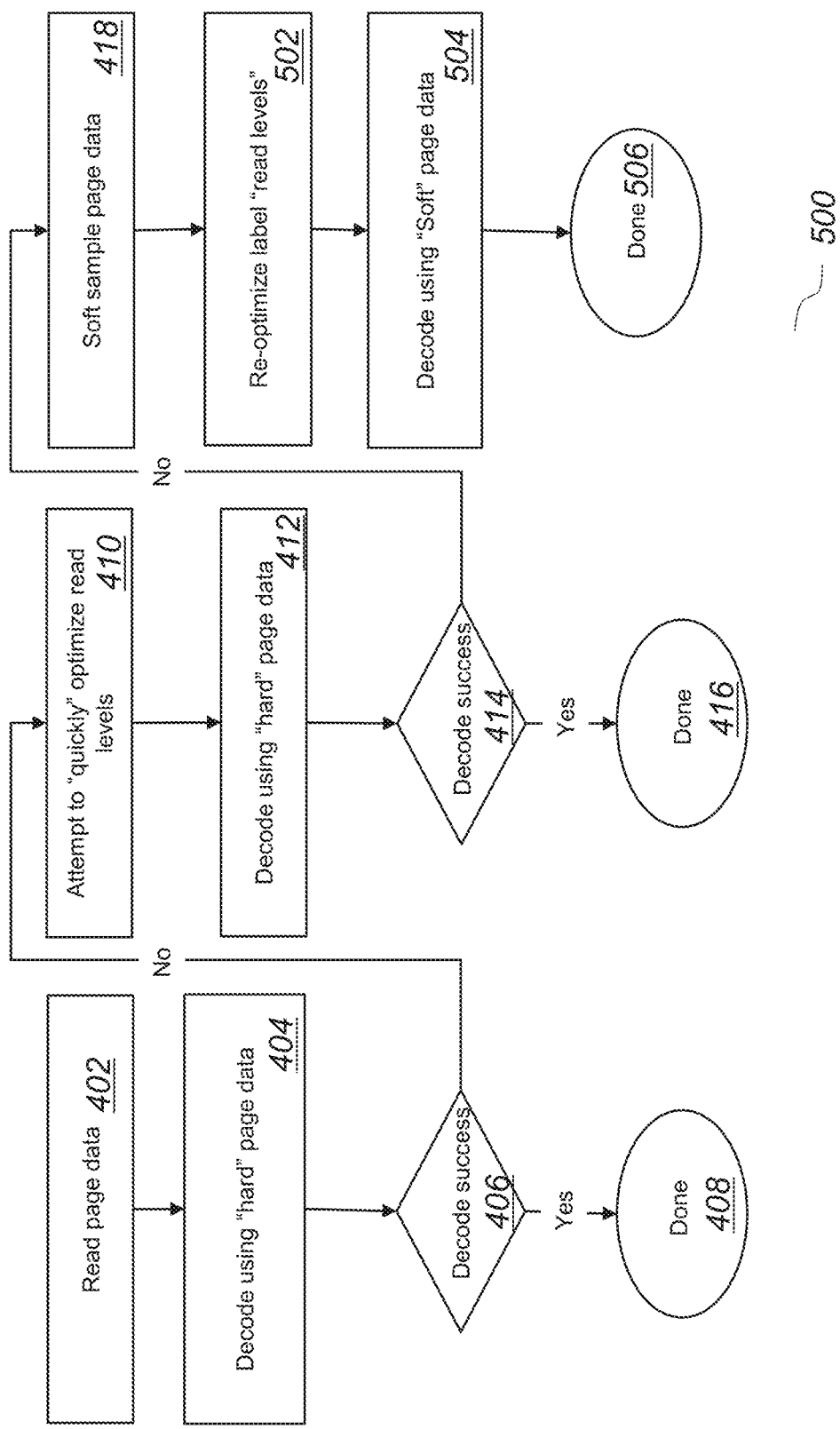
FIG. 5 is a flowchart illustrating an example methodology for reading and decoding a page in a NAND controller according to some arrangements.

FIG. 5 is a flowchart illustrating an example methodology for reading and decoding a page in a NAND controller according to some arrangements.

FIG. 5 shows a read flow 500 similar to the read flow 400 in FIG. 4 except for it includes an additional step S502 following the soft sampling (S418 in FIG. 5). In step S502, a controller may use the information gathered during the soft reads (S418) in order to tighten the optimal reads positions without actually performing additional reads but only using those reads already done for the soft decoding. In some implementations, the step S502 may be performed after performing soft decoding. For example, in step S502, a controller may reassess the positions of the optimal reads, and relabel soft data such that the middle labels lie around our new estimate for the optimal reads. This step (S502) may be then be followed by soft decoding (S504) which now performs a better job at decoding. After performing soft decoding (S504), the read flow 500 may complete (S506).

In some implementations, two tools may be used in optimizing read positions (or read thresholds): (1) SLC reads to distinguish between thresholds and (2) label histogram calculation. As mentioned previously with reference to FIG. 1B to FIG. 1D, during the soft sampling operation, a NAND device can also perform SLC reads in order to distinguish between cells lying around different read thresholds. In the example shown in FIG. 1B, for the lower page, the device can perform an SLC read at threshold TH3 (which is set to be exactly between TH1 and TH5). In the example shown in FIG. 1D, for the upper page, the device can perform an SLC at threshold TH5. Similarly, referring to FIG. 1C, for the middle page, the device can perform two SLC reads at TH3 and TH5 to differentiate between cells lying around TH2, TH4 and TH6.

Figure 6:
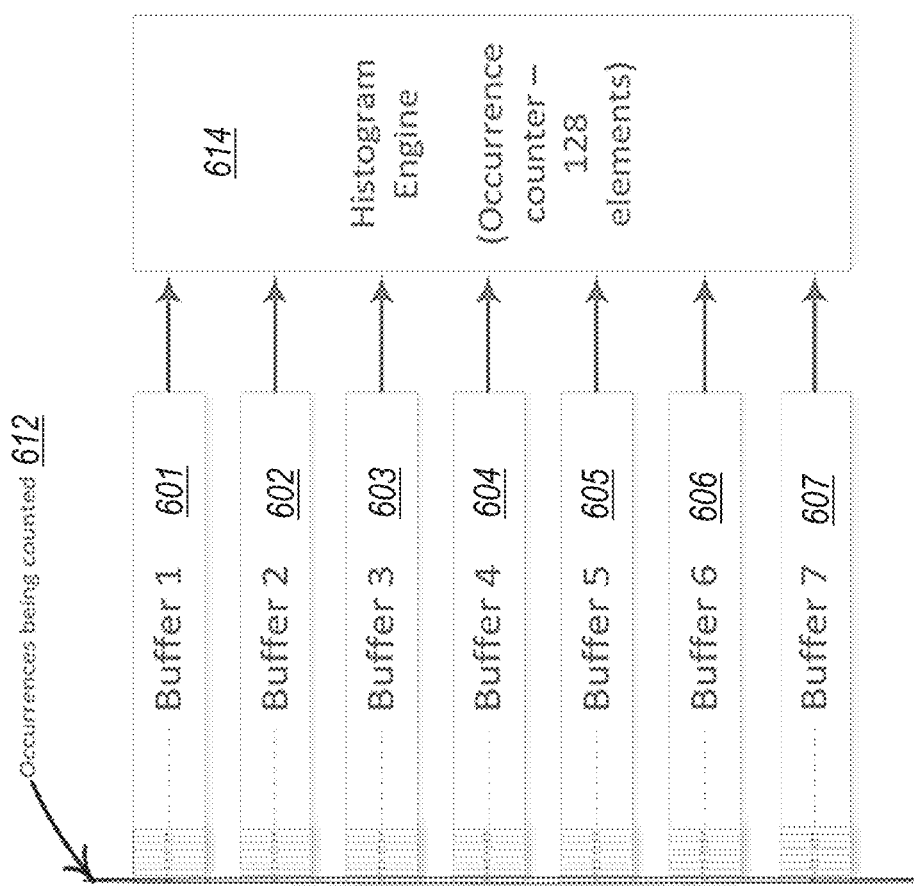
FIG. 6 illustrates an example histogram engine according to some arrangements.

FIG. 6 illustrates an example histogram engine according to some arrangements. Referring to FIG. 6, a histogram engine 614 may count an occurrence 612 of label combinations. The occurrence counts (or histogram) can be then used to calculate optimal threshold positions. In some implementations, the histogram engine 614 may count the label occurrence across 7 buffers 601-607. The first 5 buffers 601-605 may contain soft labels and the last two buffers 606-607 may contain either one or two SLC read results (see FIG. 1B to FIG. 1D). The histogram engine 614 may count the occurrence of each possible bit combinations, across corresponding bits in the 7 buffers. As there are 7 buffers there are 128 possible combinations. In addition, the maximum count may be the number of bits in a buffer.

Figure 7:
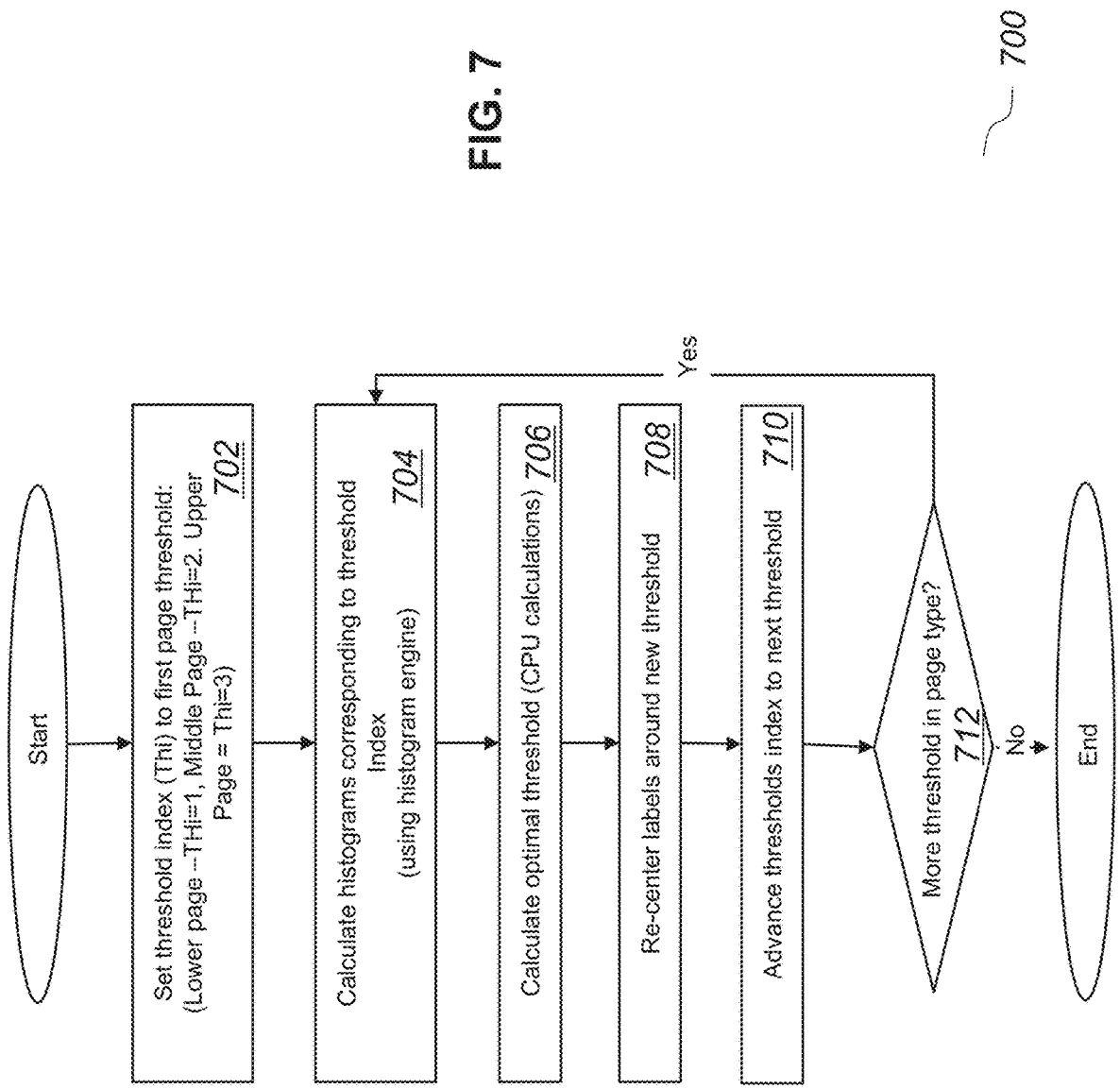
FIG. 7 is a flowchart illustrating an example methodology for estimating threshold voltages according to some arrangements.

FIG. 7 is a flowchart illustrating an example methodology for estimating threshold voltages according to some arrangements. FIG. 7 shows a high level flow 700 of threshold estimation. The flow may set a threshold index (S702), and iterate per threshold (S704, S706, S708, S710, and S712). The iteration may contain the following steps: (step S704) calculating a label histogram, for example, by adding to the labels SLC reads in order to distinguish between the histograms around each threshold; (step S706) calculating new read threshold based on label histogram; and (step S708) re-labeling, for example, by re-centering labels around the new optimal threshold. These three steps will be detailed in the following sections.

In step S704, histogram calculation may be performed. As mentioned above, soft decoding may be performed using a labeling engine (e.g., labeling engine 200 in FIG. 2A), and by the end of 31 iterations (for example), the 5-bit labels can be stored in Buffers 1-5. Labeling can be done either with the labeling engine in FIG. 2A or FIG. 2B.

Here, it is assumed that the labeling engine 250 in FIG. 2B. After completing the soft reads, a NAND device or a controller may perform SLC reads to distinguish between the cell VT distributions around each page threshold as follows:

Lower page: 1×SLC read at TH3 to Buffer 6, Buffer 7 is set to all 0s
Middle page: 2×SLC reads at TH3 and TH5 to Buffers 6 and 7 respectively
Upper page: 1×SLC read at TH5 to Buffer 6, Buffer 7 is set to all 0s Buffers 6 and 7 can be used now to distinguish between cells lying around each thresholds according to Table 1.

TABLE 1

Buffer value selection for label histogram in pre-soft tracking

| Threshold | | 1 | 2 | 3 | 4 | 5 | 6 | 7 |
|---|---|---|---|---|---|---|---|---|
| Label value selection | Buffer 6 | 1 | 1 | 1 | 0 | 0 | 0 | 0 |
| | Buffer 7 | — | 1 | — | 1 | — | 0 | — |

In some implementations, after performing all reads, a NAND device or a controller may use the histogram engine on all 7 buffers. The device may obtain 128 label occurrence counters where the label occurrence also includes up to 2 additional SLC read results.

In some implementations, the device can distinguish between histogram counters belonging to each threshold by an element index. Element index for threshold THindex can be calculated by the following formula: ThCorr(THindex)×32+histIndex where histIndex is between 0 and 31. The value of ThCorr (THindex) can be taken from Table 2.

TABLE 2

Re-centering labeling table parameters

| Threshold | 1 | 2 | 3 | 4 | 5 | 6 | 7 |
|---|---|---|---|---|---|---|---|
| Label value selection v | 1 | 1 | 1 | −1 | −1 | 1 | −1 |
| ThCorr | 32 | 96 | 32 | 64 | 0 | 0 | 0 |

In some implementations, the histogram counters may be read into the CPU RAM. However, the labels may be ordered in opposite directions, depending on the threshold being read (see FIG. 1B to FIG. 1D, for example). Therefore, during copying of the histograms counters, a NAND device or a controller may reverse the order of the counters such that in RAM, the counters will always start with the left most labels and end with the right most label for each threshold. The v line in Table 2 can be used to decide whether to reverse or not the counters for each threshold. For example, if v==1, the device may reverse the counter orders.

In step S706, the device may perform optimal threshold calculation. Optimal threshold calculation may be performed in many ways, based on the histogram counters obtained for a given threshold. An example of such histogram counters graph is shown in FIG. 11. In some implementations, optimal threshold calculation may be performed by 3 steps: (1) histogram range assessment; (2) Laplace slope fitting; and (3) estimation of optimal read threshold. Each of these steps will be described in more detail with reference to FIG. 8 through FIG. 16. It is noted that different thresholds may be treated differently. More explicitly, threshold 1 will be treated differently than the others due to the special behavior of threshold 1.

In step S708, the device may perform relabeling, for example, by re-centering labels around optimized read thresholds. In some implementations, during soft labeling, buffer 5 may hold the "label sign" (see FIG. 2A). In some implementations, the 5 bit soft labels may be encoded using 2's complement and the "optimal read" threshold may be assumed to be between the negative and positive labels. This assumption can be held when re-centering the labels using the labeling machine around a new threshold. In some implementations, the device may re-center the labels using the labeling machine 250 in FIG. 2B. In some implementations, a labeling machine LUT table may be filled to re-center the labels. Initially the LUT table may be filled with the identity transformation. That is, each element in the LUT table may be set to its index (0-127 modulo 64). Next, the device may set the LUT elements to shift the labels around the target threshold. The device may set 32 LUT table elements using the following function:

$$\text{LUT}(i+\text{ThCorr})=\max(\min((i+v*\text{shift}),31),0) \text{ for all } i=0\ldots31 \quad \text{(Equation 1)}$$

Where the v and ThCorr values are found in Table 2, shift=the shift between the re-estimated optimal read position and the original one ($\text{TH}_{NEW}-\text{TH}_{ORIG}$).

As mentioned above, the step S706 of optimal threshold calculation (see FIG. 7) may be performed by 3 steps: (1) histogram range assessment; (2) Laplace slope fitting; and (3) estimation of optimal read threshold.

In performing (1) histogram range assessment, a NAND device or a controller may decide on a slice of a continuous range of histogram counters (out of 32 counters in this example) which will be used for finding the estimated optimal read threshold. The goal is to capture the slope on the right side of the lobe to the left of the optimal read threshold (right slope; see FIG. 11) and at the same time to capture the slope on the left side of the lobe to the right of the optimal read threshold (left slope; see FIG. 11). An exception to this rule is the first threshold where in many cases, the lobe to the left of the optimal threshold is not visible. The range assessment is divided into 3 parts: generic assessment which holds for all thresholds; assessment which is specific for threshold 1; and assessment which is specific for threshold 2 . . . 7. The following notations will be used: histogram values (HST), cumulative histogram values (CHST) which include the sum of histogram counters from first to current position.

Figure 8:
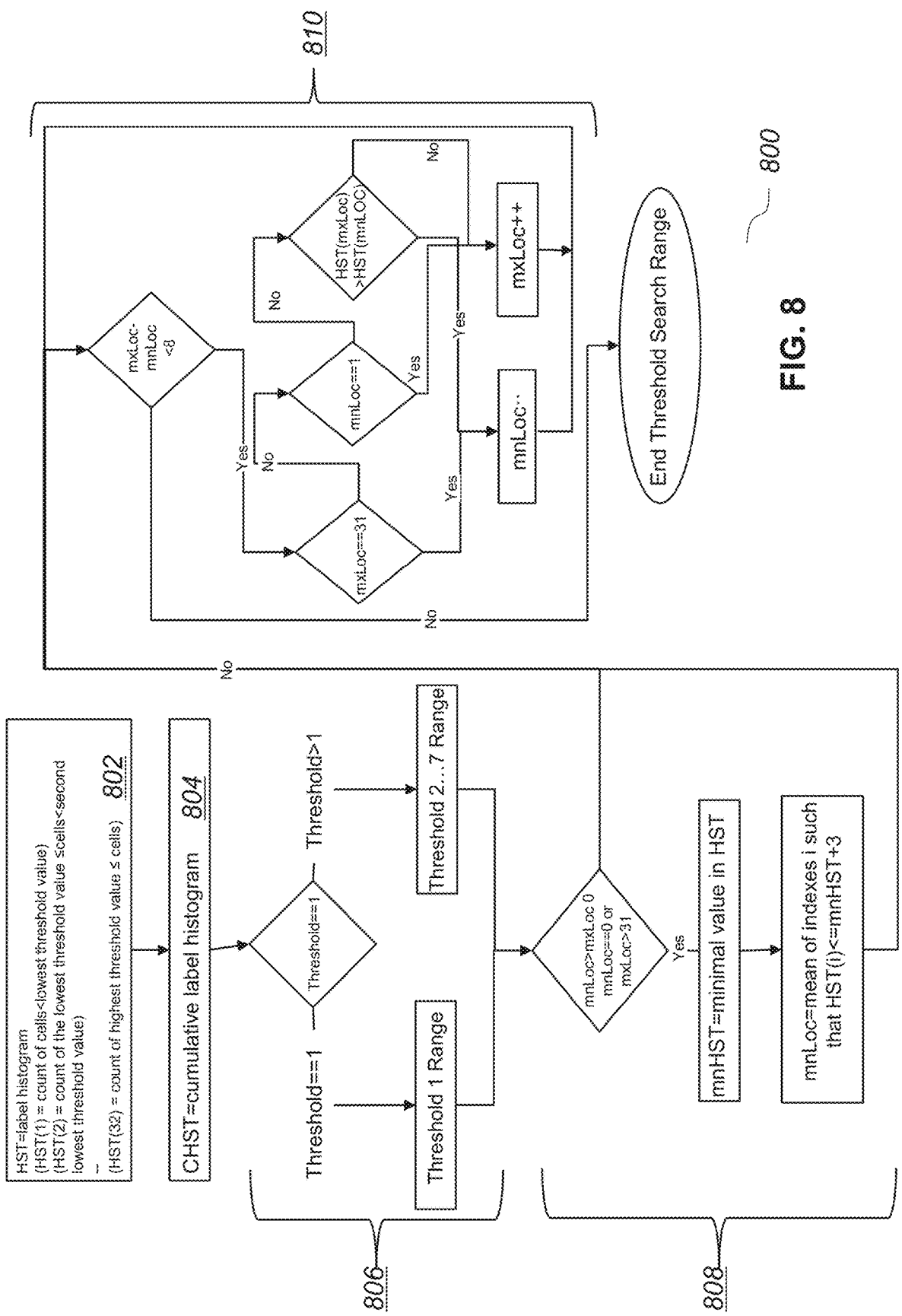
FIG. 8 is a flowchart illustrating an example methodology for determining a threshold search range according to some arrangements.

FIG. 8 is a flowchart illustrating an example methodology for obtaining an optimal threshold range according to some arrangements. FIG. 8 shows a generic process 800 which starts by obtaining the HST counters (S802) and calculating a cumulative histogram CHST (S804). Subsequently, the process may execute a threshold specific threshold assessment (S806). In case the threshold specific assessment fails, the process may choose a seed for a range around a minimum so as to guarantee a minimum range size (S808). The process may then define the range by the range between (and including) mnLoc and mxLoc variables, i.e., mnLoc, mnLoc+1, mxLoc (S810). In step S810, the process extend the range to include at least 9 counters to allow a curve fitting later on (see FIG. 13 and FIG. 14) to work properly.

Figure 9:
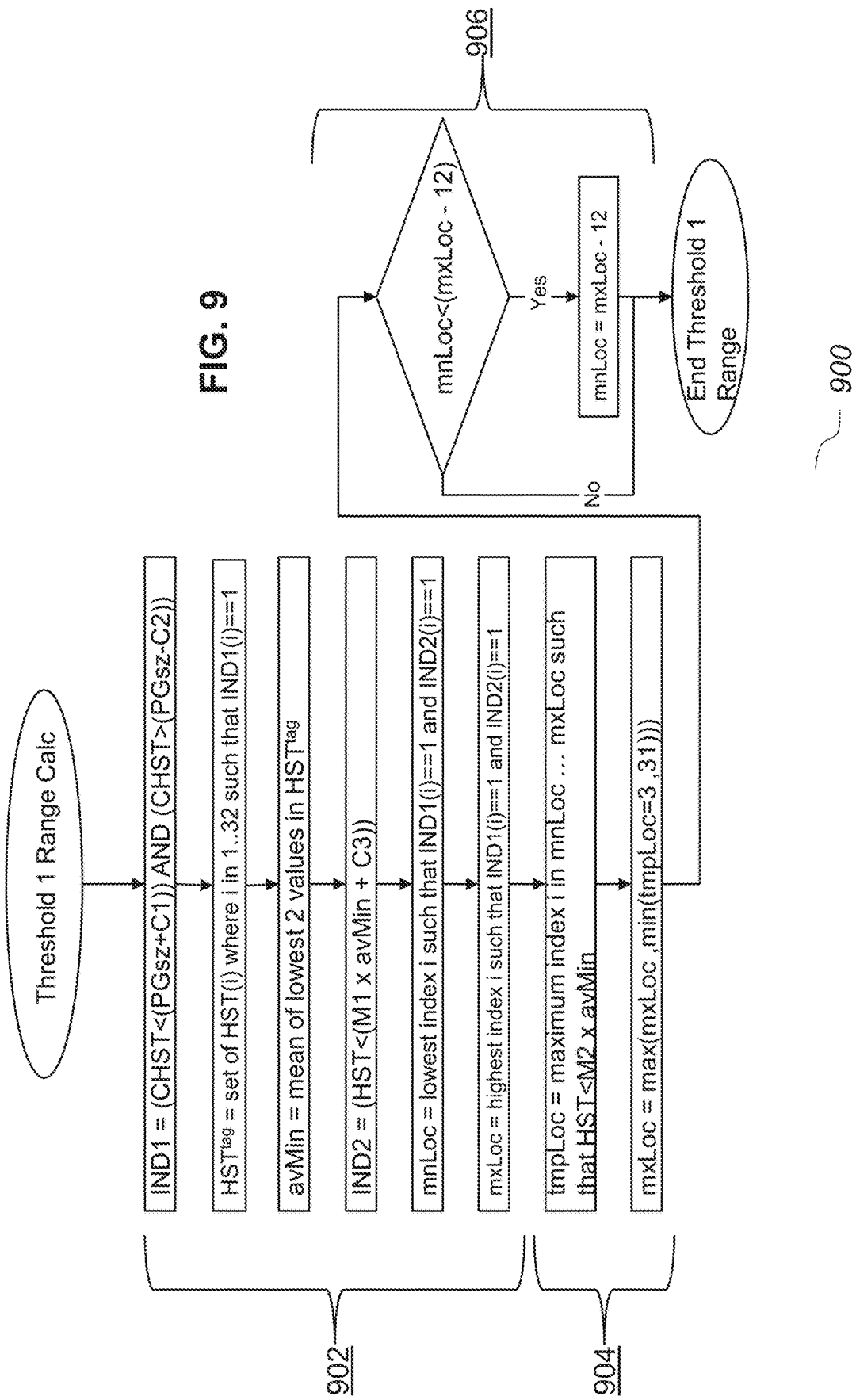
FIG. 9 is a flowchart illustrating an example methodology for generating an initial range for a first threshold voltage according to some arrangements.

FIG. 9 is a flowchart illustrating an example methodology for generating an initial range for a first threshold voltage (TH1) according to some arrangements. FIG. 9 describes a process 900 for generating an initial range for the first threshold voltage (TH1). The process starts with setting an initial range based on limits of the cumulative histogram CHST and the histogram HST (S902). The process then may extend the range, if necessary, to allow a sufficient slope on the right (e.g., beyond a minimum value of a flattened histogram) for Laplacian curve fitting (S904). The process then may limit range to a maximum of 13 counters (for example) so that the overall range does not exceed 12 samples (S906). An example for the constants used in FIG. 9 is: PGsz=4584; C1=1200; C2=400; M1=2; C3=100; and M2=1.2. As a result of the process 900, the cumulative histogram within the search range can be around the number of cells in a lobe within a page or a codeword being read. In addition, the range need not be symmetrical since there may be a bias to one side due to the way the device is being programmed. In addition, the histogram can be around the position of a minimum histogram.

Figure 10:
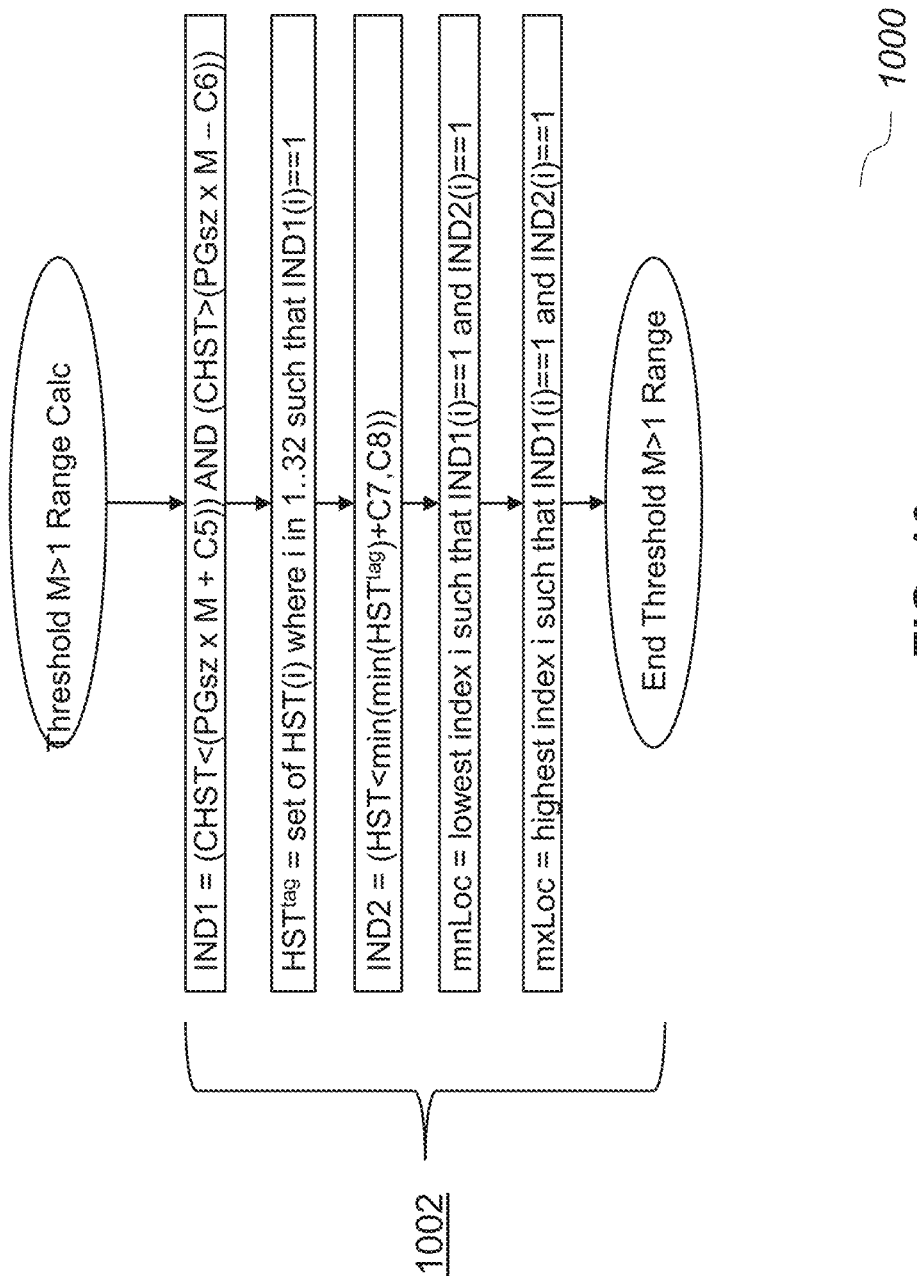
FIG. 10 is a flowchart illustrating an example methodology for generating an initial range for threshold voltages according to some arrangements.
Figure 11:
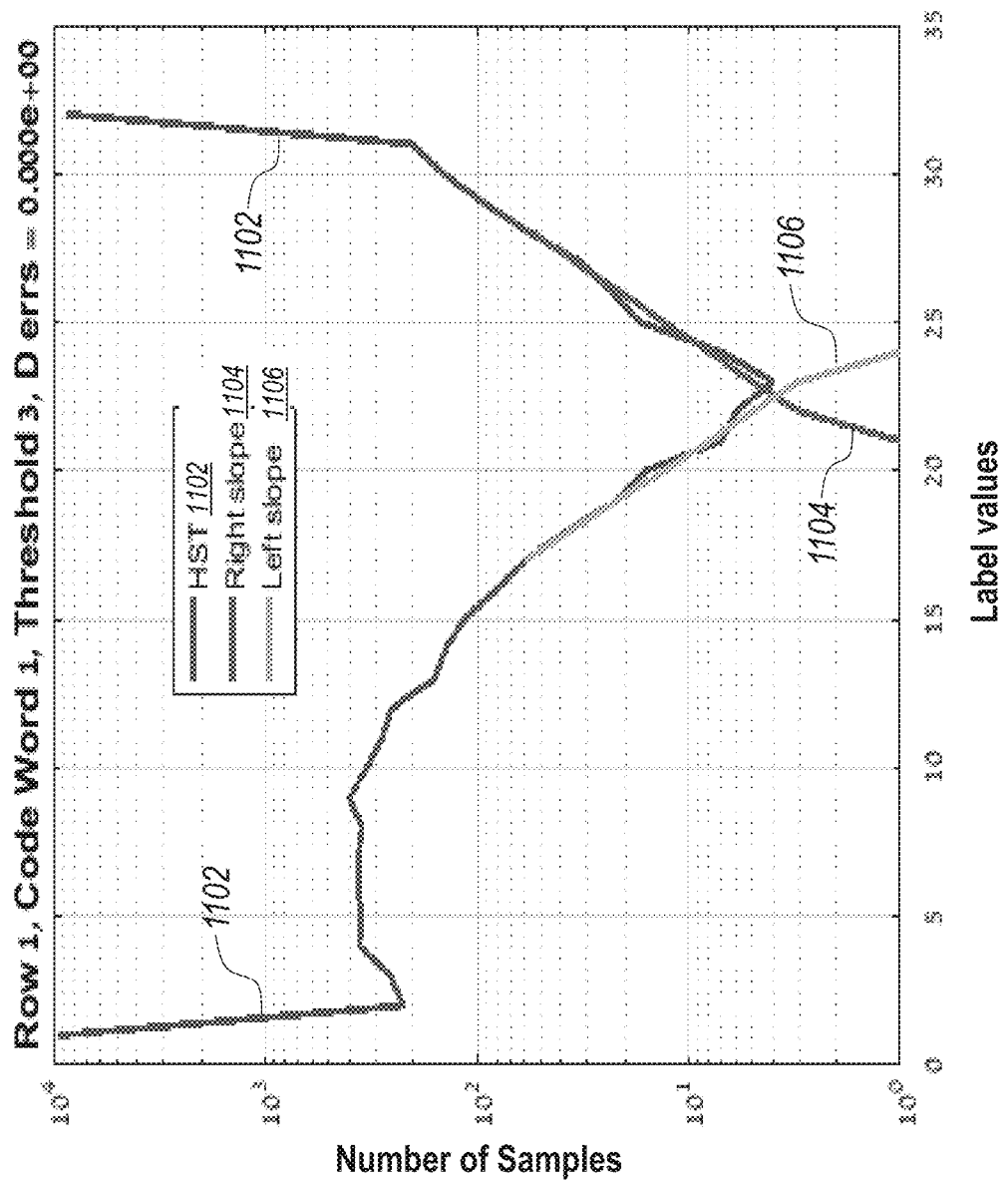
FIG. 11 illustrates example histogram counters graphs according to some arrangements.

FIG. 10 is a flowchart illustrating an example methodology for generating an initial range for threshold voltages according to some arrangements. FIG. 10 illustrates a process 1000 for generating an initial range for the rest of the thresholds (e.g., TH2, . . . , TH7). The process 1000 may set a range following an asymmetric criteria based on the cumulative histogram such that at the same time the range lies around the position of a minimum histogram within a cumulative histogram range (S1002). In some implementations, the process may set a range based on cumulative histogram and histogram limits which are based on fixed values (C8) and relative values (relative to minimal histogram values+C7) as shown in FIG. 10. An example for the constants used in FIG. 10 is: PGsz=4584; M=2 . . . 7; C5=750; C6=500; C7=63; C8=175.

FIG. 11 illustrates an example histogram counters graph according to some arrangements. X-axis represents label values while Y-axis represents the number of samples per label value. The label values are those after they have been reversed (if v equals to −1) according to Table 2. The graph shows histogram values (HST) 1102. FIG. 11 also shows a right slope 1104 and a left slope 1106 as a result of curve fitting (see FIG. 12 to FIG. 14).

Figure 12:
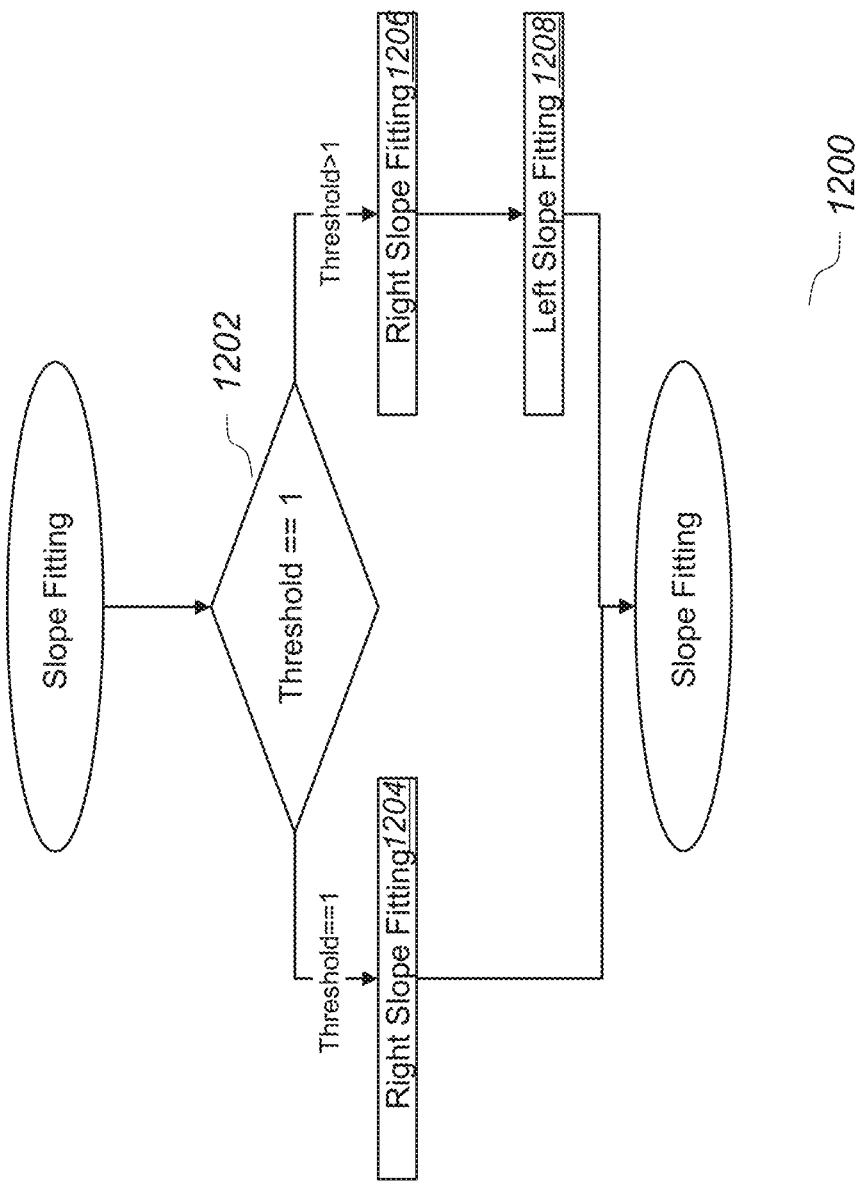
FIG. 12 is a flowchart illustrating an example methodology for Laplace slope fitting according to some arrangements.

FIG. 12 is a flowchart illustrating an example methodology for Laplace slope fitting according to some arrangements.

In performing (2) Laplace slope fitting for optimal threshold calculation (step S706 in FIG. 7), a NAND device or a controller may fit the best Laplacian slope on each side of the optimal read threshold. In some implementations, the thresholds may be treated differently. Referring to FIG. 12, a process 1200 may check if the threshold is the first threshold (TH1) or the rest of the thresholds (TH2 to TH7) (S1202). For the first threshold, the process may only matches a slope on the left side of the lobe to the right of the threshold (S1204 for right slope fitting). For the rest of the thresholds (TH2 to TH7), the process matches a slope on both sides of the thresholds (S1206 for right slope fitting and S1208 for left slope fitting).

Figure 13:
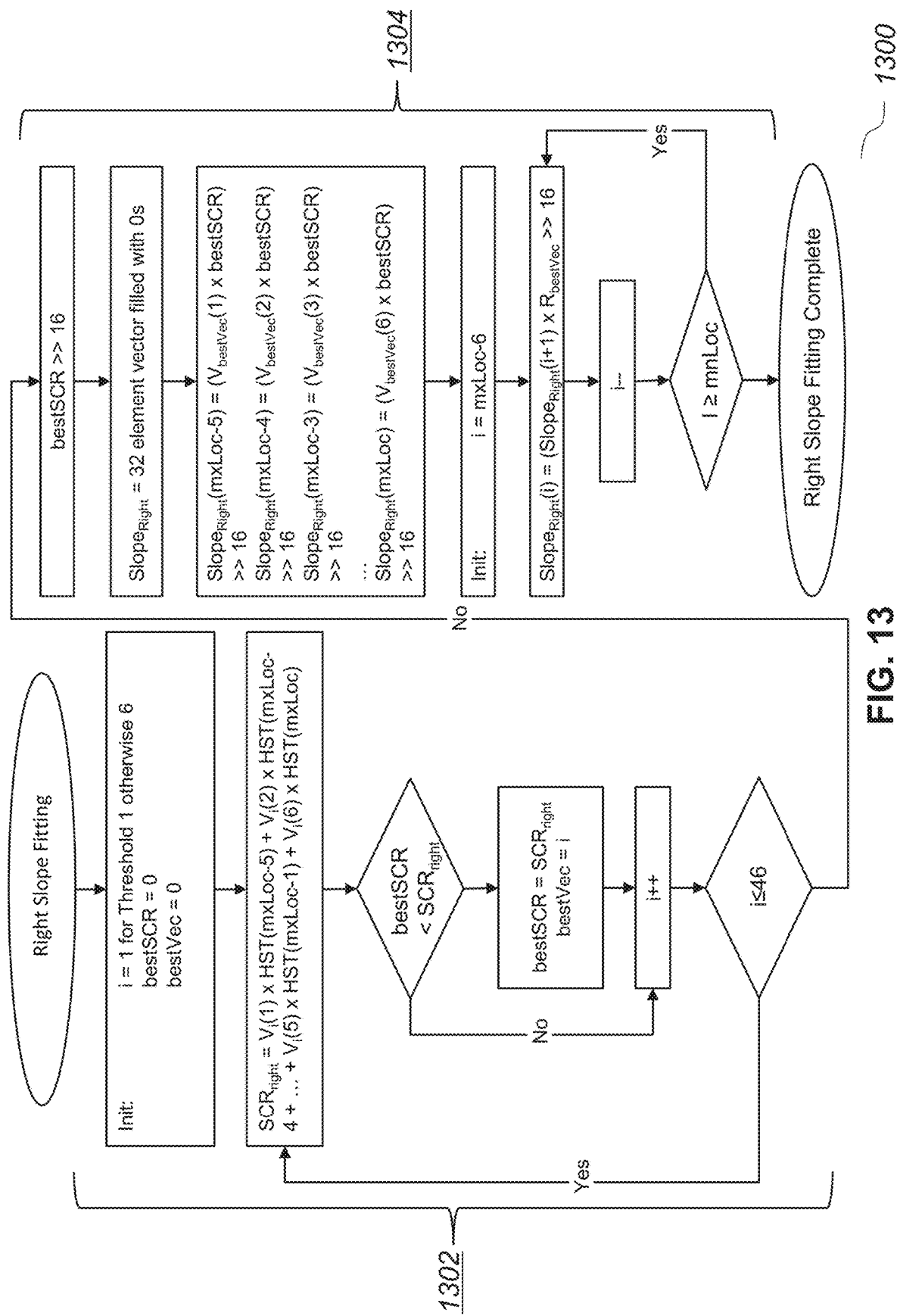
FIG. 13 is a flowchart illustrating an example methodology for right slope fitting according to some arrangements.
Figure 14:
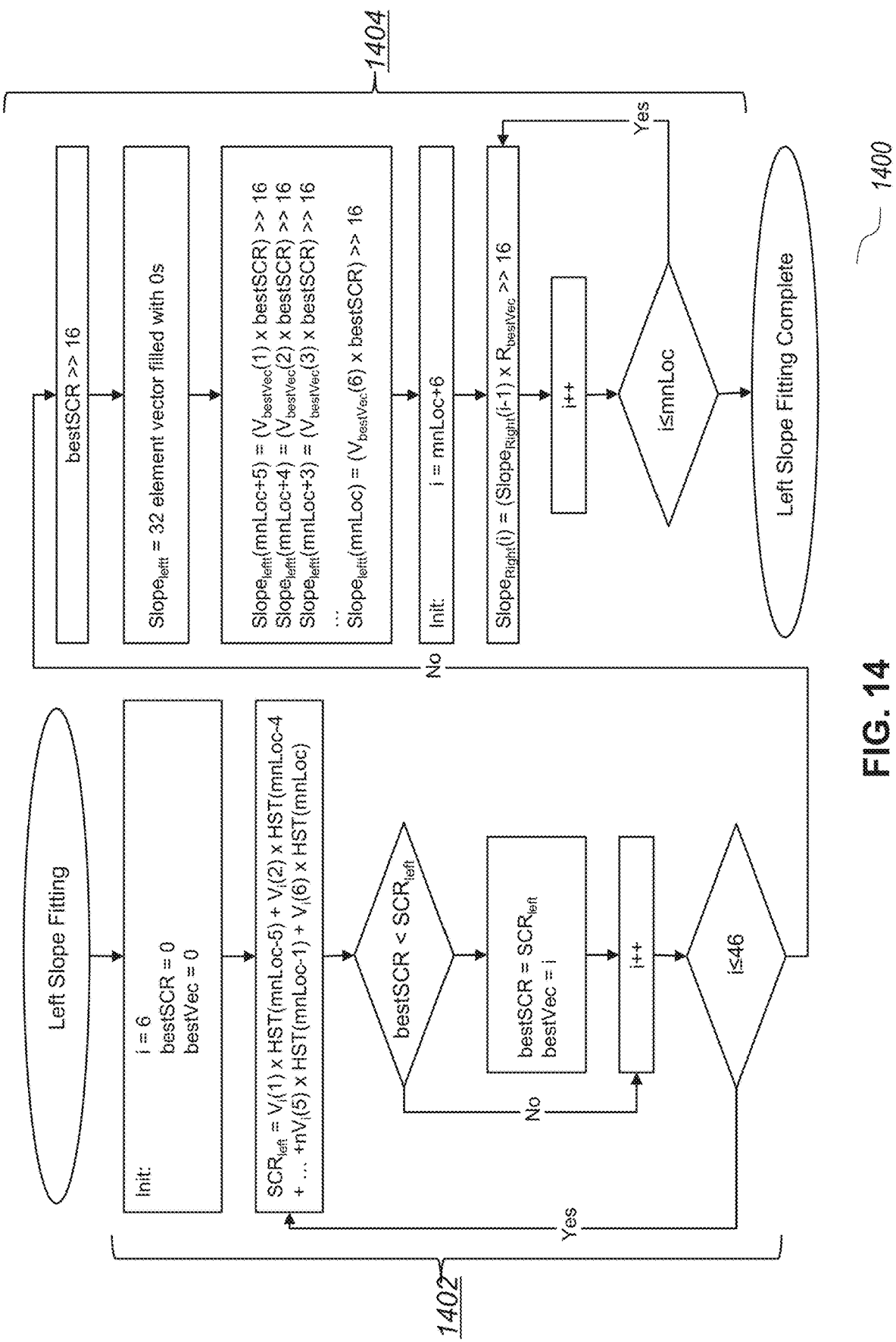
FIG. 14 is a flowchart illustrating an example methodology for left slope fitting according to some arrangements.

FIG. 13 is a flowchart illustrating an example methodology for right slope fitting according to some arrangements. FIG. 14 is a flowchart illustrating an example methodology for left slope fitting according to some arrangements. FIG. 13 and FIG. 14 describe processes of using Table 3 to fit the Laplace curves on the right and left to end up with the a match similar to that shown in FIG. 11.

Referring to FIG. 13, a right slope fitting process 1300 may find a curve with best fit (S1302) and create a curve with best fit within an optimization range (=S1304). In step S1302, for slopes on the right of the thresholds, the process 1300 may match a slope corresponding to highest 6 counters in a selected range (on the right of the read thresholds).

Similarly, referring to FIG. 14, a left slope fitting process 1400 may find a curve with best fit (S1402) and create a curve with best fit within an optimization range (=S1404). In step S1402, for a slope on the left of the read thresholds the process 1400 may match a slope corresponding to lowest 6 counters in a selected range (on the left of the read thresholds).

In some implementations, to fit a slope a process match a function given by $Ae^{\alpha \cdot k}$ to the selected histogram counters as follows. The multiplier A of $Ae^{\alpha \cdot k}$ may be optimized to obtain a minimal square error with respect to the selected counters in the range. Here, α is enumerated to obtain lowest square error, depending the thresholds and whether it is a right or left side slope, as follows:

For Threshold 1: α=0.05:0.01:0.5 (initial value:step:last value) for the right slope For Threshold 2 to 7: α=0.1:0.01:0.5 for the right slope, α=−0.1:−0.01:0.5 for the left slope An example of such matched slopes is shown in FIG. 11.

In some implementations, in order to maintain a code that runs with fixed precision CPU, Table 3 may be defined below. In Table 3 the slope fitting curve elements (called "V elements") V(1 . . . 6) and R column are defined along indexes. The R column is used to extend the slope further down on each direction beyond the outmost 6 elements of the range. In some implementations, the table contains 46 by 6×16 bit unsigned array for the V elements. In some implementations, the V elements is given as a 46×6 point normalized exponent table defined by:

$$V_i(k) = \left\lfloor \frac{e^{(i+4) \times k \times 0.01}}{\sqrt{\sum_{j=1}^{j=6} e^{2 \times (i+4) \times j \times 0.01}}} \times 2^{16} \right\rfloor,$$ (Equation 2)

$$k = 1, \ldots, 6 \text{ and } i = 1, \ldots, 46$$

In some implementations, the R column is given by a 46×1 16 bit unsigned array and defined by $$R_i = \lfloor e^{-(i+4) \times 0.01} \times 2^{16} \rfloor, \; i=1, \ldots, 46$$ (Equation 3)

16 bit quantization with 16 bit×16 bit=32 bit multiplier is assumed.

TABLE 3

Elements V for curve slope fitting

| Index | V(1) | V(2) | V(3) | V(4) | V(5) | V(6) | R |
|---|---|---|---|---|---|---|---|
| 1 | 23440 | 24642 | 25905 | 27234 | 28630 | 30098 | 62340 |
| 2 | 22789 | 24198 | 25694 | 27283 | 28970 | 30762 | 61719 |
| 3 | 22143 | 23748 | 25470 | 27317 | 29298 | 31422 | 61105 |
| 4 | 21503 | 23294 | 25234 | 27336 | 29613 | 32079 | 60497 |
| 5 | 20870 | 22836 | 24986 | 27339 | 29914 | 32731 | 59895 |
| 6 | 20245 | 22374 | 24727 | 27328 | 30202 | 33378 | 59299 |
| 7 | 19628 | 21910 | 24458 | 27301 | 30476 | 34020 | 58709 |
| 8 | 19019 | 21444 | 24178 | 27261 | 30736 | 34655 | 58125 |
| 9 | 18420 | 20977 | 23889 | 27205 | 30982 | 35284 | 57547 |
| 10 | 17830 | 20509 | 23591 | 27136 | 31214 | 35905 | 56974 |
| 11 | 17250 | 20042 | 23285 | 27054 | 31432 | 36519 | 56407 |
| 12 | 16681 | 19576 | 22972 | 26958 | 31636 | 37125 | 55846 |
| 13 | 16123 | 19111 | 22652 | 26850 | 31825 | 37722 | 55290 |
| 14 | 15576 | 18648 | 22326 | 26729 | 32000 | 38311 | 54740 |
| 15 | 15041 | 18188 | 21994 | 26596 | 32161 | 38891 | 54196 |
| 16 | 14517 | 17731 | 21657 | 26452 | 32309 | 39462 | 53656 |
| 17 | 14006 | 17278 | 21316 | 26297 | 32442 | 40023 | 53122 |
| 18 | 13506 | 16830 | 20971 | 26132 | 32562 | 40575 | 52594 |
| 19 | 13019 | 16386 | 20623 | 25957 | 32669 | 41117 | 52071 |
| 20 | 12545 | 15947 | 20273 | 25772 | 32763 | 41650 | 51552 |
| 21 | 12083 | 15514 | 19921 | 25579 | 32844 | 42172 | 51039 |
| 22 | 11633 | 15087 | 19567 | 25377 | 32912 | 42685 | 50532 |
| 23 | 11196 | 14666 | 19212 | 25167 | 32968 | 43187 | 50029 |
| 24 | 10771 | 14252 | 18857 | 24950 | 33012 | 43680 | 49531 |
| 25 | 10359 | 13844 | 18502 | 24726 | 33045 | 44162 | 49038 |
| 26 | 9959 | 13444 | 18147 | 24496 | 33066 | 44635 | 48550 |
| 27 | 9572 | 13051 | 17793 | 24260 | 33077 | 45098 | 48067 |
| 28 | 9197 | 12665 | 17441 | 24019 | 33077 | 45551 | 47589 |
| 29 | 8833 | 12287 | 17090 | 23772 | 33066 | 45994 | 47115 |
| 30 | 8482 | 11916 | 16742 | 23521 | 33046 | 46427 | 46647 |
| 31 | 8142 | 11553 | 16395 | 23266 | 33016 | 46852 | 46182 |

TABLE 3-continued

Elements V for curve slope fitting

| Index | V(1) | V(2) | V(3) | V(4) | V(5) | V(6) | R |
|---|---|---|---|---|---|---|---|
| 32 | 7813 | 11199 | 16051 | 23007 | 32977 | 47266 | 45723 |
| 33 | 7496 | 10852 | 15711 | 22745 | 32928 | 47672 | 45268 |
| 34 | 7189 | 10513 | 15373 | 22480 | 32872 | 48068 | 44818 |
| 35 | 6894 | 10182 | 15039 | 22212 | 32807 | 48455 | 44372 |
| 36 | 6609 | 9859 | 14708 | 21942 | 32734 | 48834 | 43930 |
| 37 | 6334 | 9545 | 14382 | 21671 | 32654 | 49204 | 43493 |
| 38 | 6070 | 9238 | 14059 | 21398 | 32567 | 49565 | 43060 |
| 39 | 5815 | 8939 | 13741 | 21123 | 32472 | 49918 | 42632 |
| 40 | 5569 | 8647 | 13427 | 20848 | 32371 | 50263 | 42208 |
| 41 | 5333 | 8364 | 13117 | 20572 | 32264 | 50600 | 41788 |
| 42 | 5106 | 8088 | 12813 | 20296 | 32150 | 50929 | 41372 |
| 43 | 4888 | 7820 | 12512 | 20020 | 32031 | 51250 | 40960 |
| 44 | 4678 | 7560 | 12217 | 19743 | 31907 | 51564 | 40553 |
| 45 | 4476 | 7306 | 11926 | 19468 | 31777 | 51870 | 40149 |
| 46 | 4282 | 7060 | 11641 | 19192 | 31643 | 52170 | 39750 |

Figure 15:
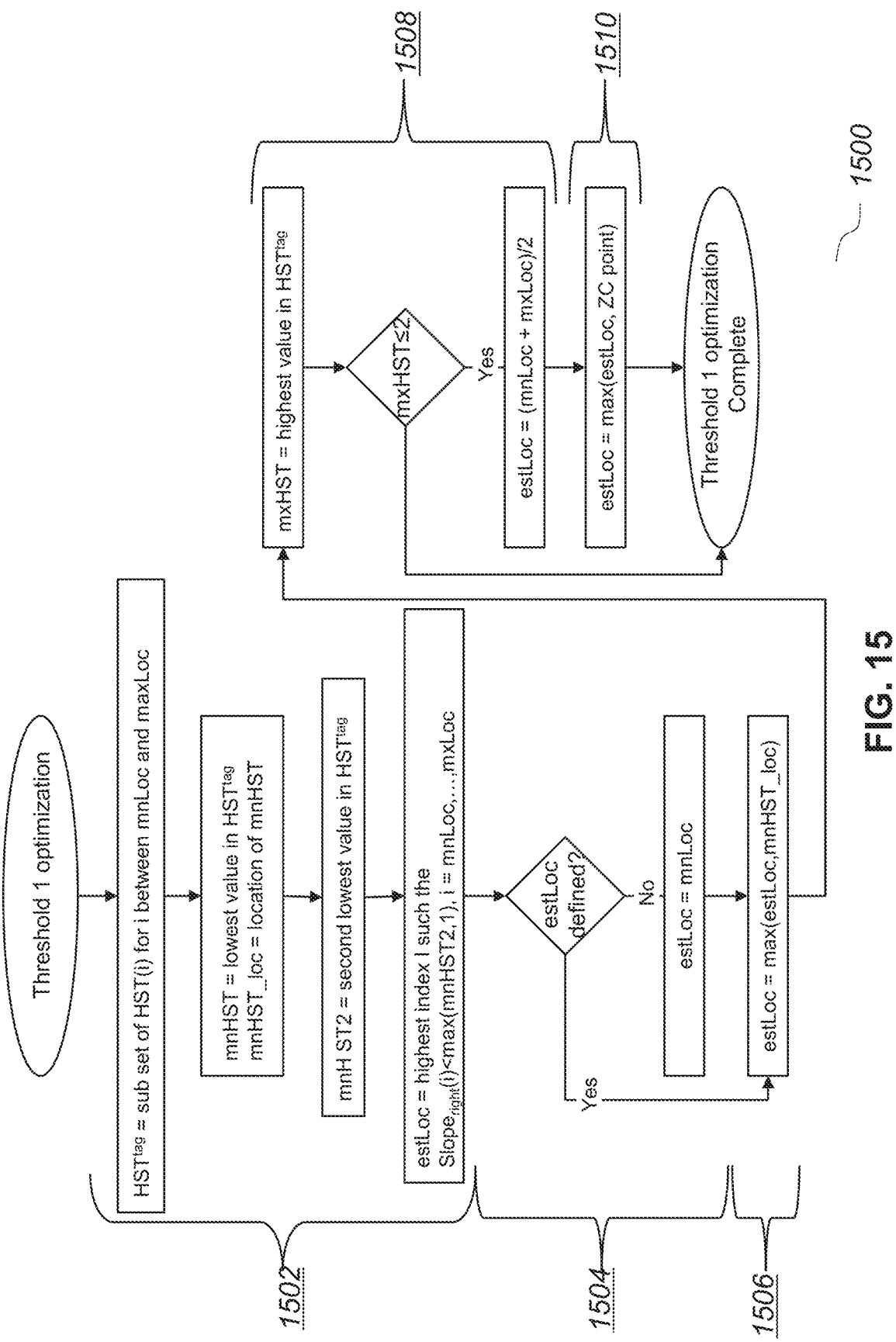
FIG. 15 is a flowchart illustrating an example methodology for estimating optimal threshold 1 voltage according to some arrangements.
Figure 16:
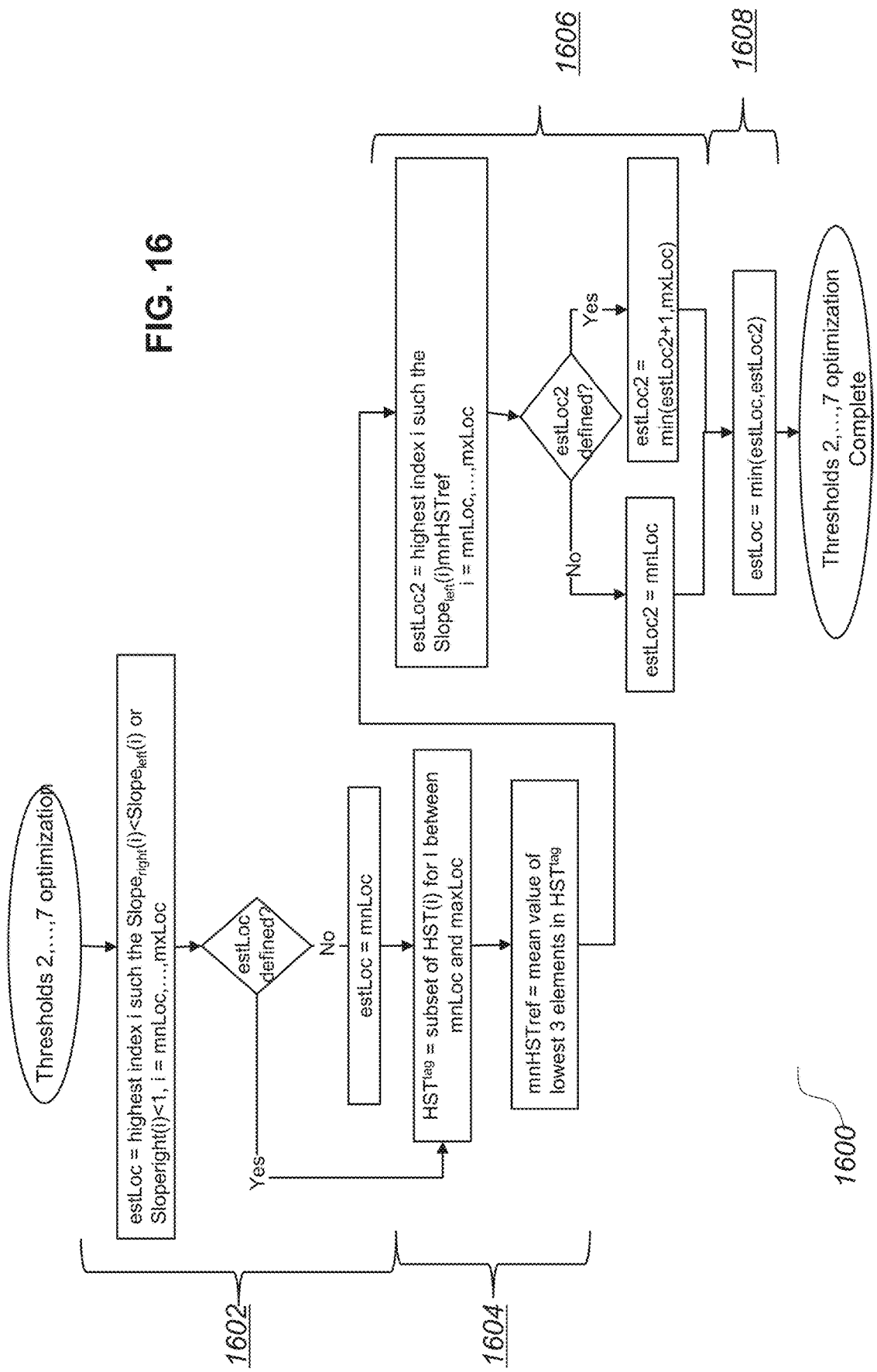
FIG. 16 is a flowchart illustrating an example methodology for estimating optimal threshold voltages according to some arrangements.

FIG. 15 is a flowchart illustrating an example methodology for determining or estimating an optimal threshold voltage for the first threshold (TH1) according to some arrangements. FIG. 16 is a flowchart illustrating an example methodology for determining or estimating optimal threshold voltages for the rest of the thresholds (TH2 to TH7) according to some arrangements. As shown in FIG. 15 and FIG. 16, an optimal read threshold estimation can be performed based on the fitted slopes and the search range. Here, the estimation processes may be different for TH1 (see FIG. 15) and for TH2, . . . , TH7 (see FIG. 16).

FIG. 15 illustrates an estimation process 1500 for optimization of the optimal read for the first thresholds (TH1). The process 1500 may start with using the right slope to estimate the optimal threshold as a point where the slope becomes lower than a reference minimal value in the histogram (S1502). For example, in step S1502, the process may choose the optimal read threshold to be the point where the continuation of the right slope intersects with the "lowest" histogram level in a range. The process may then handle the case in which a point where the slope intersects with a reference value is undefined (S1504). For example, if there is no such intersection, the process may choose the optimal position to be the minimal range point. The process may correct estimation if a minimum point is to the right of the estimated optimal threshold (S1506). For example, the process may guarantee that it does not choose the optimal read point to be lower than the position of the lowest histogram point. If the entire search range is low, the process may choose a mid-point of the range (S1508). The process may also choose an optimal threshold such that a threshold below the actual zero threshold of TH1 is not chosen (S1510). For example, in step S1510, the process may choose a threshold greater than or equal to ZC point which is a TH1 zero crossing point after being translated to the relative position in the histogram table. In some implementations, in a case where within the range all histogram levels are very low and the curve fitting is not practically possible, the process may choose the optimal read point to be the middle of the range.

FIG. 16 illustrates an estimation process 1600 for optimization of the optimal read for the rest of the thresholds (TH2 to TH7). The process 1500 may start with performing optimal threshold estimation (for first optimal threshold estLoc) based on the intersection of the two fitted slopes (as a result of right and left slope fittings) or the intersection of the right slope with 1 (S1602). The process may prepare a reference minimum for later stage such that the reference minimum is higher for TH7 to compensate (later) for under programming in TH7 (S1604). The process may perform an alternative optimal threshold estimation (for second optimal threshold estLoc2) based on left slope intersection with the reference minimum (S1606). The process may choose the lowest of the two estimated optimal thresholds, for example, between first optimal threshold estLoc and second optimal threshold estLoc2 (S1608).

In summary, the process 1600 may calculate two alternative optimal read thresholds. The first optimal read threshold may be defined as the intersection of the matched slope on the right and on the left, and the second optimal read threshold may be defined as the point where the left slope intersects the level of the effective minimum histogram in range. The process 1600 may choose the final minimum threshold to be the lower of the two optimal read thresholds.

Referring to FIG. 17A to FIG. 22, an optional dynamic sampling will be described. In some implementations, a NAND device may sample data and dynamically set sampling ranges in order to centralize an optimal point with respect to the sampling range. In this manner, the NAND device can address the problem that optimal points that are found on the edges of the sampling ranges may cause difficulties during the soft decoding later on and may require soft resampling of the data around the new found optimal points. By setting the sampling range dynamically, the NAND device can significantly increase the chance that the optimal thresholds will lie around a mid-point of the sampling ranges and reduce the frequency of soft resampling.

Figure 17B:
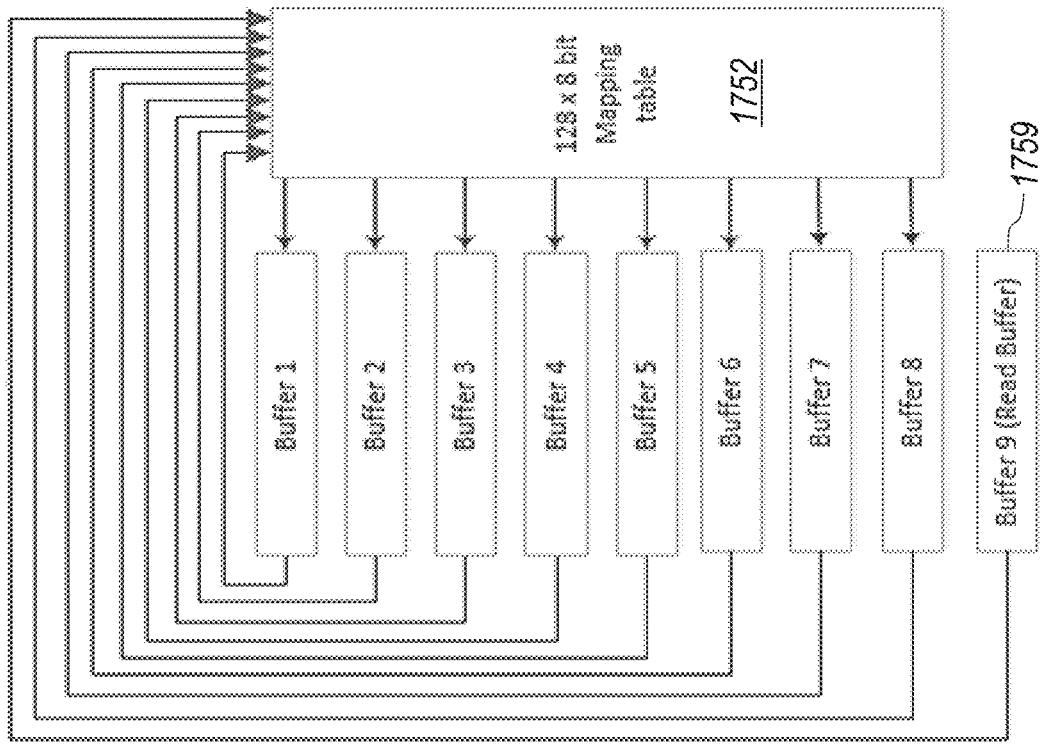
FIG. 17A and FIG. 17B illustrate example labeling engines according to some arrangements.
Figure 17A:
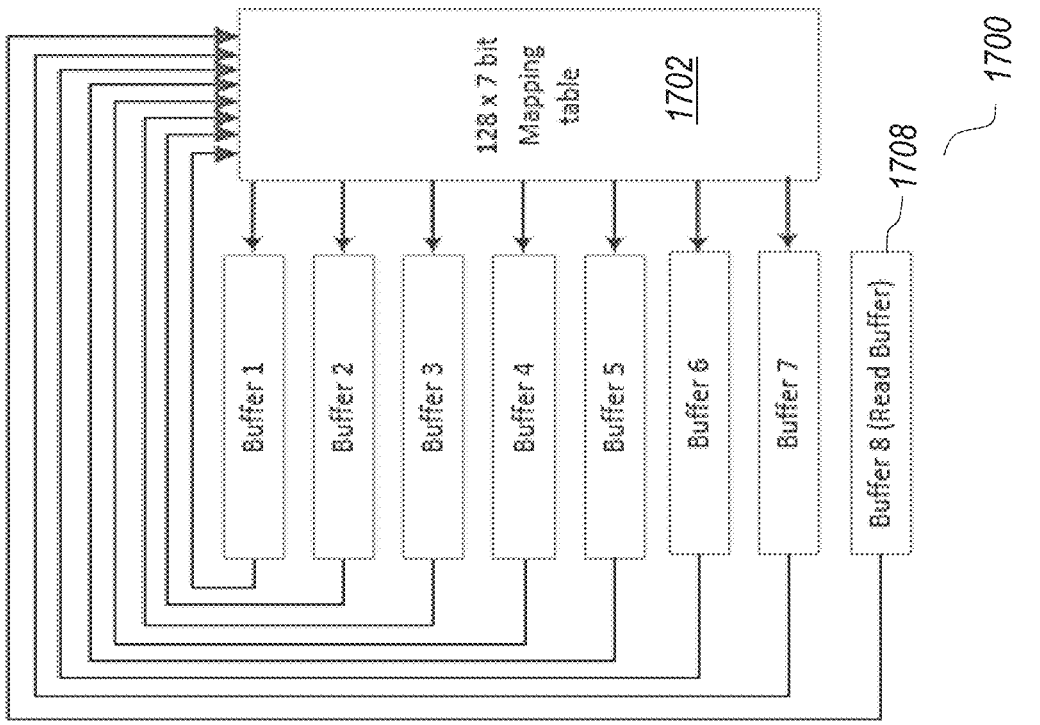

FIG. 17A and FIG. 17B illustrate example labeling engines according to some arrangements. FIG. 17A shows a labeling engine 1700 including 7 buffers, a page read buffer 1708, and a 128×7 bit mapping table 1702. FIG. 17B shows a labeling engine 1750 including 8 buffers, a page read buffer 1759, and a 128×8 bit mapping table 1752. To perform dynamic sampling we suggest using a larger labeling machine as labeling engine 1700 depicted in FIG. 17A.

Figure 18:
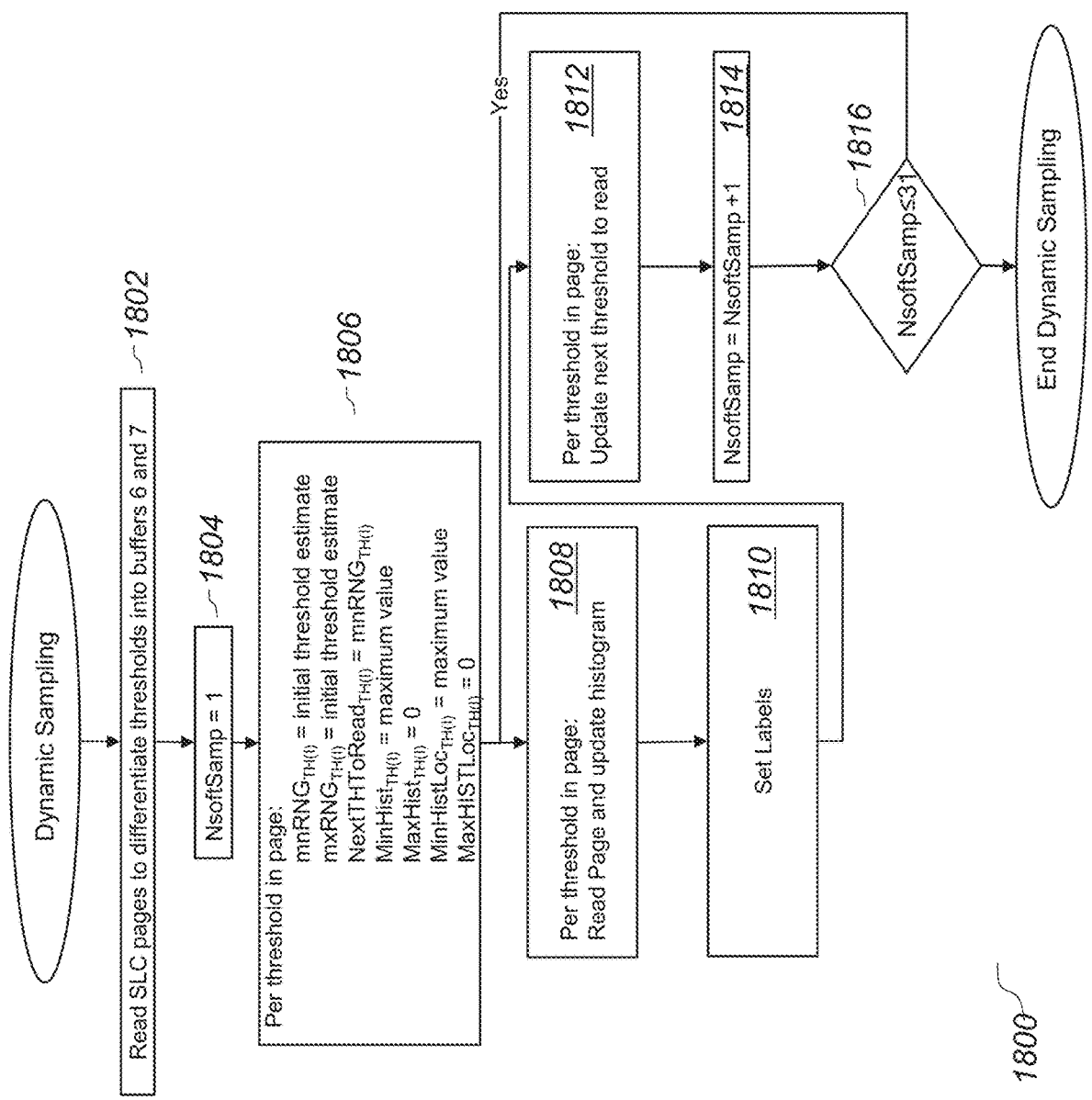
FIG. 18 is a flowchart illustrating an example methodology for dynamic sampling according to some arrangements.

FIG. 18 is a flowchart illustrating an example methodology for dynamic sampling according to some arrangements. FIG. 18 illustrates a process 1800 of dynamic sampling. The process 1800 may start with reading the SLC pages that allow to distinguish between the different thresholds within the page (S1802). For example, referring to FIG. 1B to FIG. 1D, the process may perform SLC read at TH3 for lower page, SLC reads at TH3 and TH5 for middle page, and/or SLC read at TH5 for upper page. Next, parameter initialization may be performed (S1804, S1806) and then a loop that reads the 31 soft samples. Within the loop (S1808, S1810, S1812, S1814, S1816), the following steps may be performed. Per threshold in a page, the process may perform soft sample page read and update histograms and a cumulative distribution function (CDF) (S1808). The histogram and CDF updates may be used later on for determining where to position the next sampling thresholds. Step 1808 will be described in more detail below with reference to FIG. 19. Next, the process may set labels based on soft information (S1810). For example, the process may set labels based on soft information stored in buffers 1 through 5 with buffer 1 being the LSB (see FIG. 17A). Step 1810 will be described in more detail below with reference to FIG. 20A and FIG. 20B. Next, the process may update of next threshold to read (S1812). Step 1812 will be described in more detail below with reference to FIG. 21.

Figure 19:
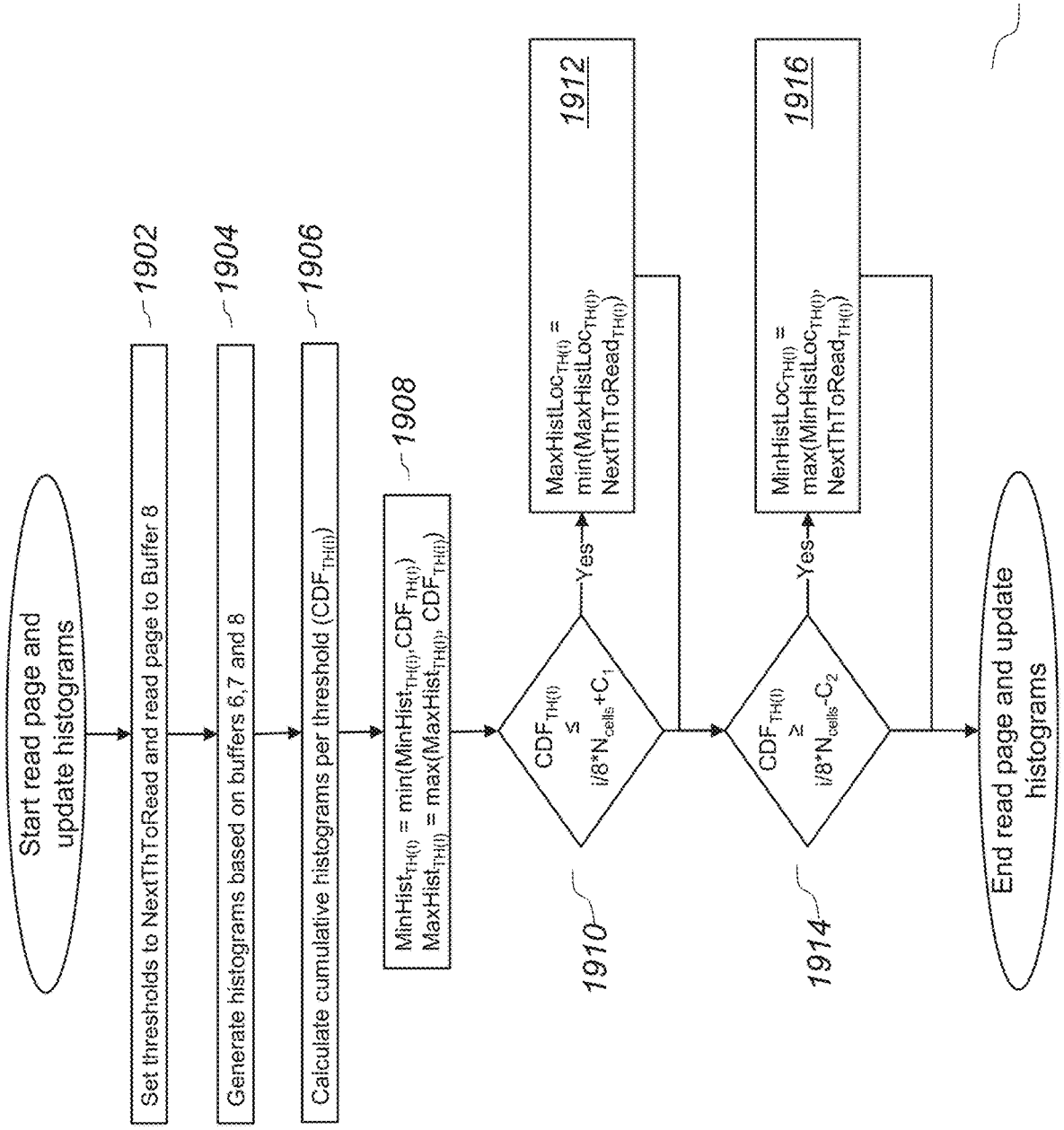
FIG. 19 is a flowchart illustrating an example methodology for updating histograms and a cumulative distribution function (CDF) according to some arrangements.

FIG. 19 is a flowchart illustrating an example methodology for updating histograms and a cumulative distribution function (CDF) according to some arrangements. FIG. 19 depicts a process 1900 for performing step 1808 in FIG. 18. Assuming that a labeling engine similar to the labeling engine 1700 in FIG. 17A is used, the process 1900 may start by reading a soft sample into Buffer 8 of the labeling engine 1700 and then generating a histogram (S1904) and cumulative histogram (CDF) per threshold (of the page) using a histogram engine (e.g., 1700 in FIG. 17A) based on buffers 6, 7 and 8 (S1906). The process may keep track of a minimum CDF level (MinHist) and a maximum CDF (MaxHist) per threshold within the samples read so far (S1908). Next, the process may track or determine whether the locations of the sample threshold for their reads were within a range around an expected CDF value (which is threshold index*number of cells/8) (S1910 and S1914). The process may store locations in MaxHistLoc and MinHistLoc such that the optimal threshold is expected to lie between MaxHistLoc and MinHistLoc (S1912 and S1916).

Figure 20A:
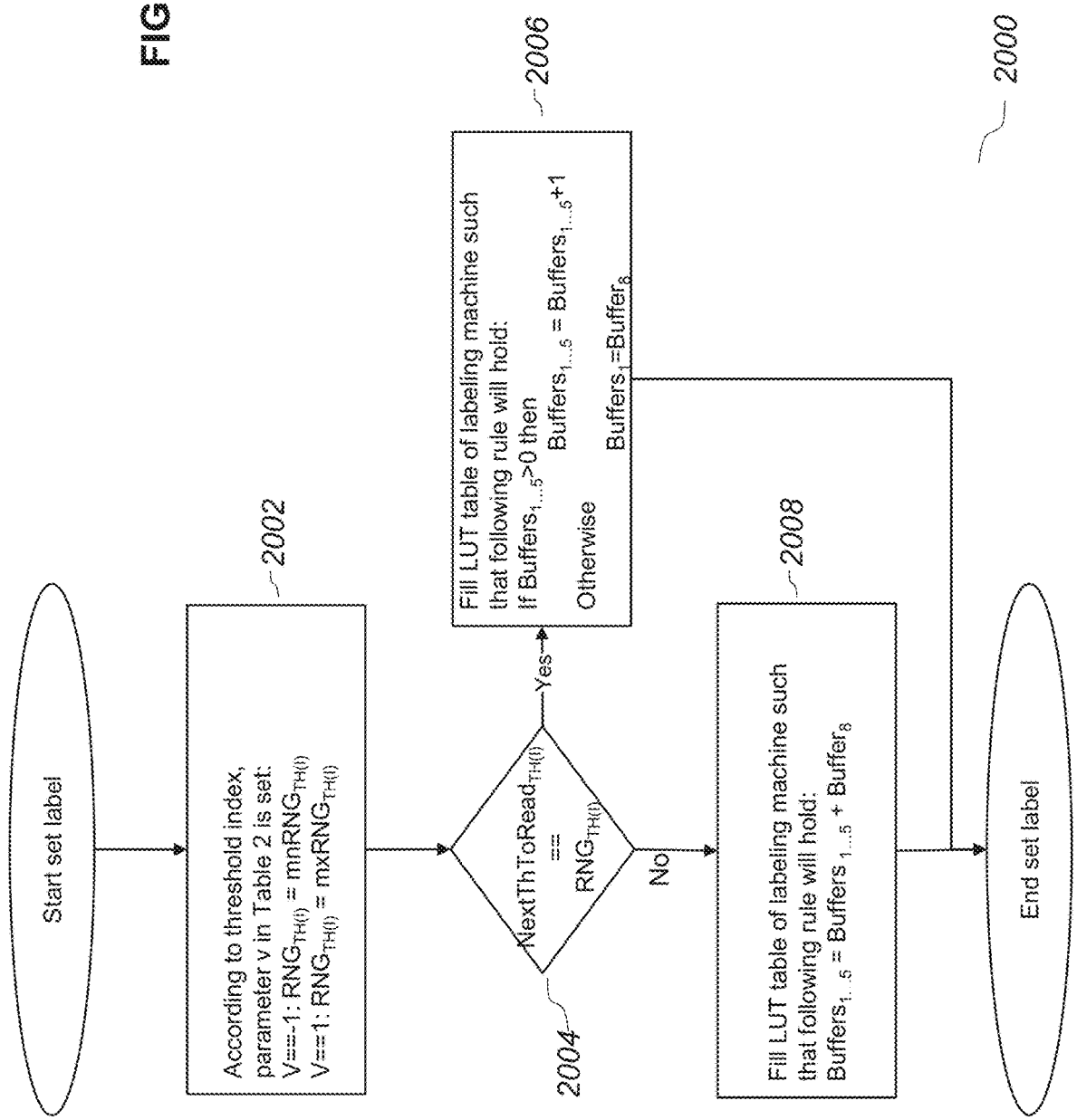
FIG. 20A and FIG. 20B are flowcharts illustrating an example methodology for setting labels according to some arrangements.
Figure 20B:
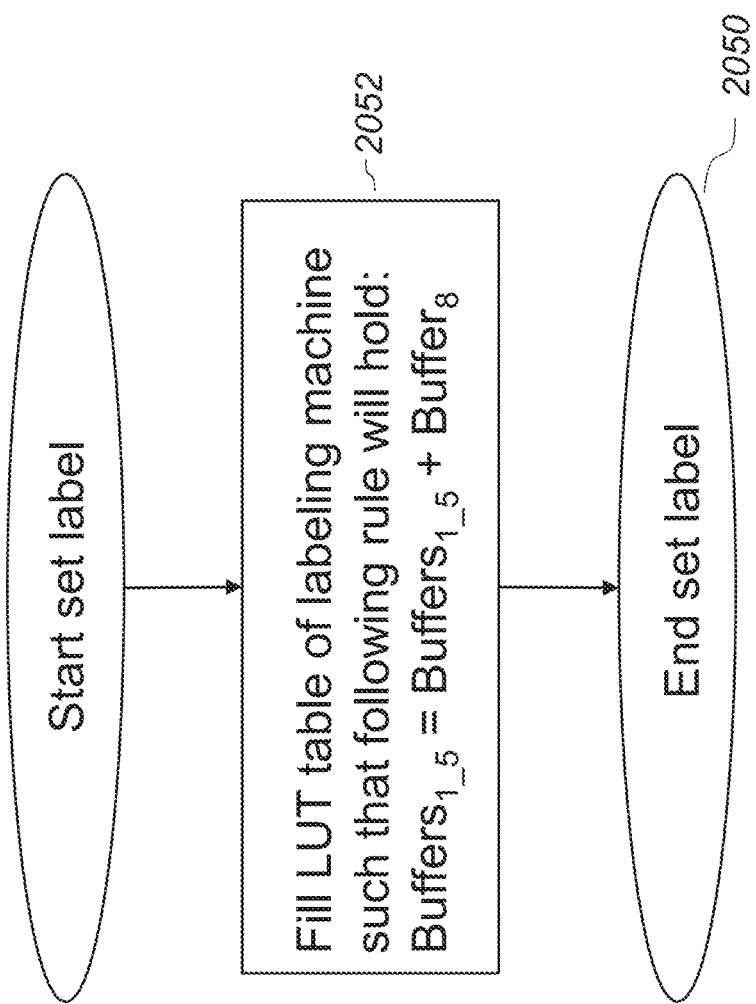

FIG. 20A and FIG. 20B are flowcharts illustrating example methodologies for setting labels according to some arrangements.

FIG. 20A depicts a process 2000 for performing one method of performing step 1810 in FIG. 18. The process 2000 may start with performing parameter initialization (S2002) and checking if the read threshold is within the range (S2004). Next, the process may update the labels such that the label gets the highest index at which read changed from 0 to 1 (S2006). In step S2006, the process may update the labels for the cases where the new read position corresponds to labels that are lower than were previously sampled. In step S2008, the process may update the labels for the cases where the new read position corresponds to labels that are higher than were previously sampled.

FIG. 20B depicts a process 2050 for performing another method of performing step 1810 in FIG. 18. The process 2050 may perform a more average like calculation of label, in case there have been several changes from 0 to 1 in the read (S2052).

FIG. 21 is a flowchart illustrating an example methodology for updating a next threshold voltage according to some arrangements.

FIG. 21 depicts a process 2100 for performing step 1812 in FIG. 18. The process 2100 may determine or decide on the next threshold to read based on a minimum CDF level (MinHist) and a maximum CDF level (MaxHist). The process 2100 may determine whether MaxHist is smaller than or equal to a high edge of an expected CDF (threshold index*number of cells/8+C1) (S2102). In response to determining that MaxHist is smaller than or equal to the high edge of the expected CDF, the process may extend the sample range higher by increasing a maximum of the range (e.g., adding Tick to MaxRNG) (S2104). In this manner, if the maximum sample CDF is lower than the high edge of the range, the process can extend the sample range higher.

In response to determining that MaxHist is greater than the high edge of the expected CDF, the process 2100 may determine whether MinHist is greater than or equal to a low edge of an expected CDF (threshold index*number of cells/8−C2) (S2106). In response to determining that MinHist is greater than or equal to the low edge of the expected CDF, the process may extend the sample range lower by decreasing a minimum of the range (e.g., subtracting Tick from MinRNG) (S2108). In this manner, if we maximum CDF is higher than the high edge of the expected range but the minimum CDF is also higher than the low edge of the expected CDF range, the process can extend the sample range lower.

Figure 22:
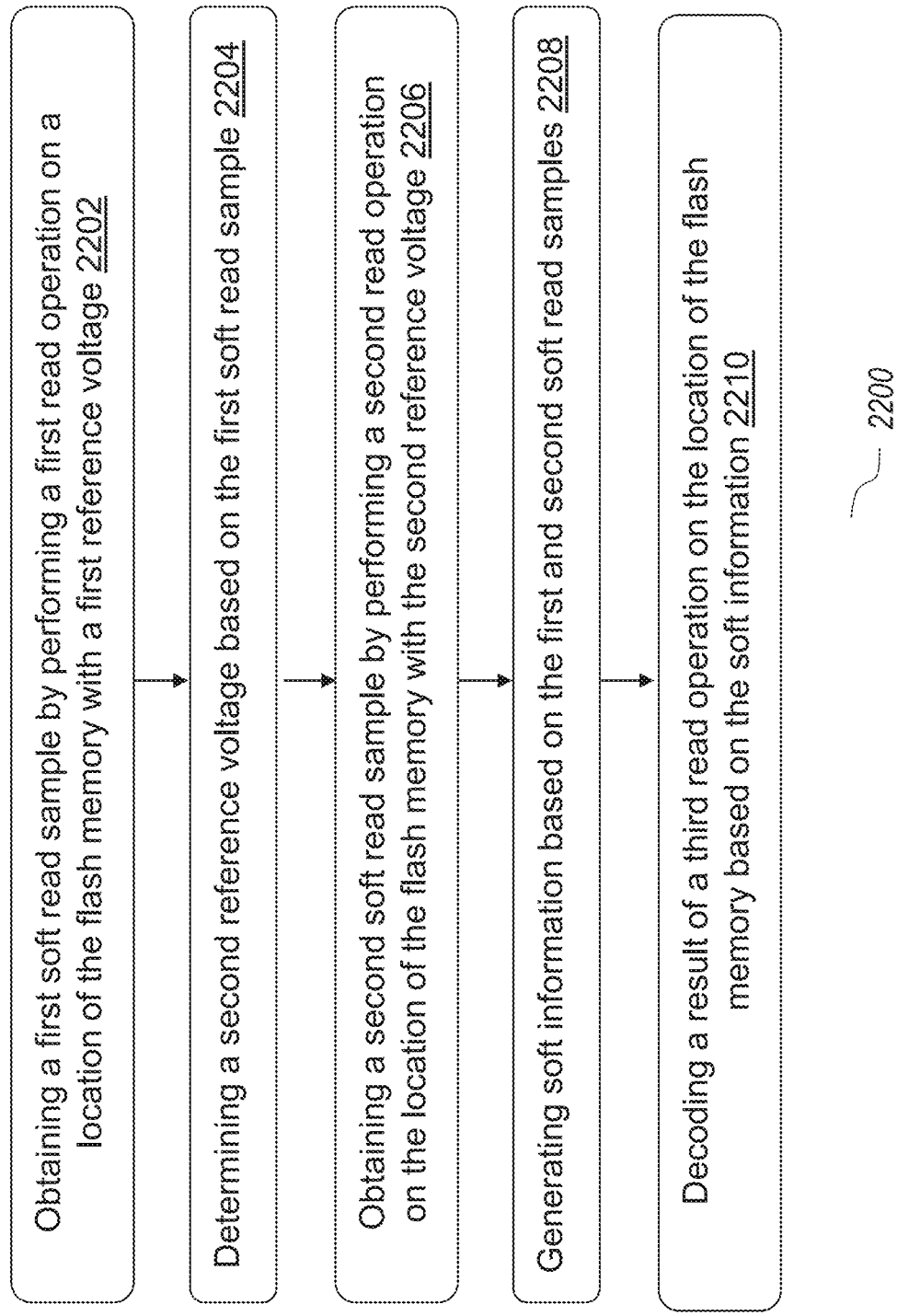
FIG. 22 is a flowchart illustrating an example methodology for dynamically determining optimal read reference voltages based on soft read samples according to some arrangements.

Next, in response to determining that MinHist is smaller than the low edge of the expected CDF, the process 2100 may determine whether a first difference between the maximum of the range and MaxHist is smaller than or equal to a second difference between the minimum of the range and MinHist (S2110). In response to determining that the first difference is smaller than or equal to the second difference, the process may extend the sample range higher by increasing the maximum of the range (e.g., adding Tick to MaxRNG) (S2112). In response to determining that the first difference is greater than the second difference, the process may extend the sample range lower by decreasing the minimum of the range (e.g., subtracting Tick from MinRNG) (S2114). In this manner, if a histogram or CDF already covers the expected range, the process can decide if to extend the sample range higher or lower by determining if there have already been more samples on the high end of the expected range or on the low end of the expected range. In some implementations, the process 2100 may determine the next threshold as a mid-point of the determined sample range FIG. 22 is a flowchart illustrating an example methodology for dynamically determining optimal read reference voltages based on soft read samples according to some arrangements.

In some arrangements, the example methodology relates to a process 2200 for performing operations on a flash memory (e.g., flash memory module 302 in FIG. 3) by a circuit (e.g., read circuit 310 or soft information generator 313 in FIG. 3) of a flash memory system (e.g., flash memory system 300 in FIG. 3).

In this example, the process 2200 begins in step S2202 by obtaining a first soft read sample by performing a first read operation on a location of the flash memory with a first reference voltage (e.g., reading a soft sample into Buffer 8 of the labeling engine 1700 in step S1808 in FIG. 18 and in step S1904 in FIG. 19). As used herein, a location on the flash memory refers to a physical location on a page of a block of the flash memory, which can be identified by a physical address.

In step S2204, in some arrangements, the circuit may be configured to determine a second reference voltage based on the first soft read sample (e.g., updating a next threshold to read in S1812 in FIG. 18 and the process 2100 in FIG. 21).

In some implementations, in determining the second reference voltage, the circuit may be configured to determine a sampling range (e.g., sampling range defined by MaxRng and MinRng in FIG. 21) based on the first soft read sample and determine the second reference voltage from within the sampling range (e.g., determine a next reference voltage from within the sampling range determined by the process 2100 in FIG. 21). The second reference voltage may be a mid-point of the sampling range. For example, referring to FIG. 21, the process 2100 may determine the next threshold as a mid-point of the determined sample range.

In some implementations, the circuit may be configured to generate a histogram based on a plurality of soft read samples (e.g., HST as shown in FIG. 11). In determining the sampling range, the circuit may be configured to update the histogram based on the first soft read sample (e.g., updating a histogram in step 1808 in FIG. 18 and the process 1900 in FIG. 19) and determine the sampling range based on the histogram (e.g., determining the sampling range by the process 2100 in FIG. 21). In generating the histogram, the circuit may be further configured to generate a histogram per reference voltage (e.g., generating a histogram per threshold in step 1808 in FIG. 18).

In some implementations, in generating the histogram, circuit may be configured to generate a cumulative histogram (e.g., CHST or CDF) based on read results of a plurality of reference voltages.

The circuit may be further configured to determine whether a threshold value of a maximum level of the cumulative histogram (e.g., MaxHist in FIG. 21) is greater than or equal to a maximum value of an expected cumulative histogram (e.g., (threshold index*number of cells/8+C1) in FIG. 21). In response to determining that the threshold value of the maximum level of the cumulative histogram is smaller than the maximum value of the expected cumulative histogram, the circuit may be configured to increase the maximum value of the sampling range (e.g., adding Tick to MaxRNG in FIG. 21).

In response to determining that the threshold value of a minimum level of the cumulative histogram (e.g., MinHist in FIG. 21) is greater than or equal to a minimum value of the expected cumulative histogram (e.g., (threshold index*number of cells/8−C2) in FIG. 21), the circuit may be configured to decrease a minimum value of the sampling range (e.g., subtracting Tick from MinRNG in FIG. 21).

In some implementations, the circuit may be further configured to determine whether a difference between the threshold value of the maximum level of the cumulative histogram and the maximum value of the expected cumulative histogram is smaller than or equal to a difference between a threshold value of the minimum level of the cumulative histogram and a minimum value of the expected cumulative histogram. In response to determining that the difference between the threshold value of the maximum level of the cumulative histogram and the maximum value of the expected cumulative histogram is smaller than or equal to the difference between the threshold value of the minimum level of the cumulative histogram and a minimum value of the expected cumulative histogram, the circuit may be configured to increase the maximum value of the sampling range (e.g., adding Tick to MaxRNG in FIG. 21).

In response to determining that the difference between the threshold value of the maximum level of the cumulative histogram and the maximum value of the expected cumulative histogram is greater than the difference between the threshold value of the minimum level of the cumulative histogram and the minimum value of the expected cumulative histogram, the circuit may be configured to decrease the minimum value of the sampling range (e.g., subtracting Tick from MinRNG in FIG. 21).

In step S2206, in some arrangements, the circuit may be configured to obtain a second soft read sample by performing a second read operation on the location of the flash memory with the second reference voltage. In step S2208, in some arrangements, the circuit may be configured to generate soft information based on the first and second soft read samples. In step S2210, in some arrangements, the circuit may be configured to decode a result of a third read operation on the location of the flash memory based on the soft information. For example, after optimizing the position of reads (S502 in FIG. 5) may be then be followed by soft decoding (S504 in FIG. 5).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for performing operations on a flash memory, the method comprising:
  obtaining one or more soft read samples, wherein obtaining one or more soft read samples includes obtaining a first soft read sample by performing a first read operation on a location of the flash memory with a first reference voltage;

estimating reference voltages from the one or more soft read samples, wherein estimating reference voltages from the one or more soft read samples includes determining a second reference voltage based on the first soft read sample; and
performing read operations on locations of the flash memory with the estimated reference voltages, wherein performing read operations on locations of the flash memory with the estimated reference voltages includes obtaining a second soft read sample by performing a second read operation on the location of the flash memory with the second reference voltage.

2. The method of claim 1, wherein
the method further comprises:
 generating soft information based on the first and second soft read samples; and
 decoding a result of a third read operation on the location of the flash memory based on the soft information.

3. The method of claim 1, wherein determining the second reference voltage comprises:
 determining a sampling range based on the first soft read sample; and
 determining the second reference voltage from within the sampling range.

4. The method of claim 3, wherein the second reference voltage is a mid-point of the sampling range.

5. The method of claim 3, further comprising:
 generating a histogram based on a plurality of soft read samples,
 wherein determining the sampling range comprises
  updating the histogram based on the first soft read sample, and
  determining the sampling range based on the histogram.

6. The method of claim 5, wherein generating the histogram comprises generating a cumulative histogram based on read results of a plurality of reference voltages.

7. The method of claim 6, further comprising:
 determining whether a threshold value of a maximum level of the cumulative histogram is greater than or equal to a maximum value of an expected cumulative histogram; and
 in response to determining that the threshold value of the maximum level of the cumulative histogram is smaller than the maximum value of the expected cumulative histogram, increasing a maximum value of the sampling range.

8. The method of claim 7, further comprising:
 in response to determining that the threshold value of the maximum level of the cumulative histogram is greater than or equal to the maximum value of the expected cumulative histogram, decreasing a minimum value of the sampling.

9. The method of claim 7, further comprising:
 determining whether a difference between the threshold value of the maximum level of the cumulative histogram and the maximum value of the expected cumulative histogram is smaller than or equal to a difference between a threshold value of a minimum level of the cumulative histogram and a minimum value of the expected cumulative histogram;
 in response to determining that the difference between the threshold value of the maximum level of the cumulative histogram and the maximum value of the expected cumulative histogram is smaller than or equal to the difference between the threshold value of the minimum level of the cumulative histogram and a minimum value of the expected cumulative histogram, increasing the maximum value of the sampling range.

10. The method of claim 9, further comprising:
 in response to determining that the difference between the threshold value of the maximum level of the cumulative histogram and the maximum value of the expected cumulative histogram is greater than the difference between the threshold value of the minimum level of the cumulative histogram and a minimum value of the expected cumulative histogram, decreasing the minimum value of the sampling range.

11. The method of claim 5, wherein generating the histogram comprises generating a histogram per reference voltage.

12. The method of claim 1, further comprising:
 setting label values for the estimated reference voltages using a mapping table.

13. The method of claim 12, wherein setting label values for the estimated reference voltages comprises:
 setting one or more elements of the mapping table to respective label values; and
 shifting the label values of the one or more elements of the mapping table such that the shifted label values are centered around one of the estimated reference voltages.

14. A flash memory system comprising:
 a flash memory; and
 a circuit for performing operations on the flash memory, the circuit being configured to:
 obtain one or more soft read samples, wherein in obtaining one or more soft read samples, the circuit is configured to obtain a first soft read sample by performing a first read operation on a location of the flash memory with a first reference voltage;
 estimate reference voltages from the one or more soft read samples, wherein in estimating reference voltages from the one or more soft read samples, the circuit is configured to determine a second reference voltage based on the first soft read sample; and
 perform read operations on locations of the flash memory with the estimated reference voltages, wherein in performing read operations on locations of the flash memory with the estimated reference voltages, the circuit is configured to obtain a second soft read sample by performing a second read operation on the location of the flash memory with the second reference voltage.

15. The flash memory system of claim 14, wherein the circuit is further configured to
 generate soft information based on the first and second soft read samples; and
 decode a result of a third read operation on the location of the flash memory based on the soft information.

16. The flash memory system of claim 14, wherein in determining the second reference voltage, the circuit is configured to:
 determine a sampling range based on the first soft read sample; and
 determine the second reference voltage from within the sampling range.

17. The flash memory system of claim 16, wherein the second reference voltage is a mid-point of the sampling range.

18. The flash memory of claim 16, wherein
the circuit is configured to generate a histogram based on a plurality of soft read samples, and in determining the sampling range, the circuit is configured to update the histogram based on the first soft read sample and determine the sampling range based on the histogram.

19. The flash memory of claim 18, wherein in generating the histogram, the circuit is configured to generate a cumulative histogram based on read results of a plurality of reference voltages.

20. The flash memory of claim 19, wherein the circuit is further configured to:
   determine whether a threshold value of a maximum level of the cumulative histogram is greater than or equal to a maximum value of an expected cumulative histogram; and
   in response to determining that the threshold value of the maximum level of the cumulative histogram is smaller than the maximum value of the expected cumulative histogram, increasing the maximum value of the sampling range.

21. The flash memory of claim 20, wherein
   in response to determining that the threshold value of the maximum level of the cumulative histogram is greater than or equal to the maximum value of the expected cumulative histogram, the circuit is configured to decrease a minimum value of the sampling range.

22. The flash memory of claim 20, wherein the circuit is further configured to:
   determine whether a difference between the threshold value of the maximum level of the cumulative histogram and the maximum value of the expected cumulative histogram is smaller than or equal to a difference between a threshold value of a minimum level of the cumulative histogram and a minimum value of the expected cumulative histogram; and
   in response to determining that the difference between the threshold value of the maximum level of the cumulative histogram and the maximum value of the expected cumulative histogram is smaller than or equal to the difference between the threshold value of the minimum level of the cumulative histogram and a minimum value of the expected cumulative histogram, increase the maximum value of the sampling range.

23. The flash memory of claim 22, wherein
   in response to determining that the difference between the threshold value of the maximum level of the cumulative histogram and the maximum value of the expected cumulative histogram is greater than the difference between the threshold value of the minimum level of the cumulative histogram and a minimum value of the expected cumulative histogram, the circuit is configured to decrease the minimum value of the sampling range.

24. The flash memory of claim 18, wherein in generating the histogram, the circuit is further configured to generate a histogram per reference voltage.

25. The flash memory of claim 14, wherein the circuit is further configured to:
   set label values for the estimated reference voltages using a mapping table.

26. The flash memory of claim 25, wherein in setting label values for the estimated reference voltages, the circuit is configured to:
   set one or more elements of the mapping table to respective label values; and
   shift the label values of the one or more elements of the mapping table such that the shifted label values are centered around one of the estimated reference voltages.

* * * * *